(12) United States Patent
Wang et al.

(10) Patent No.: US 12,191,270 B2
(45) Date of Patent: Jan. 7, 2025

(54) INTEGRATED CIRCUIT PACKAGE AND METHOD OF FORMING SAME

(71) Applicant: Taiwan Semiconductor Manufacturing Co., Ltd., Hsinchu (TW)

(72) Inventors: Chuei-Tang Wang, Taichung (TW); Wei Ling Chang, Hsinchu (TW); Chieh-Yen Chen, Taipei (TW); Chen-Hua Yu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 372 days.

(21) Appl. No.: 17/571,022

(22) Filed: Jan. 7, 2022

(65) Prior Publication Data
US 2023/0253351 A1    Aug. 10, 2023

Related U.S. Application Data

(60) Provisional application No. 63/275,534, filed on Nov. 4, 2021.

(51) Int. Cl.
*H01L 23/00* (2006.01)
*H01L 21/768* (2006.01)
*H01L 23/532* (2006.01)

(52) U.S. Cl.
CPC ........ *H01L 24/08* (2013.01); *H01L 21/76877* (2013.01); *H01L 23/53209* (2013.01); *H01L 2224/0812* (2013.01); *H01L 2224/085* (2013.01); *H01L 2224/80894* (2013.01); *H01L 2924/1437* (2013.01)

(58) Field of Classification Search
None
See application file for complete search history.

(56) References Cited

U.S. PATENT DOCUMENTS

| | | | |
|---|---|---|---|
| 10,267,990 B1* | 4/2019 | Yu | H05K 1/181 |
| 2020/0043896 A1* | 2/2020 | Yu | H01L 21/8221 |
| 2020/0312774 A1* | 10/2020 | Yu | H01L 21/6835 |
| 2020/0402942 A1* | 12/2020 | Chen | H01L 24/95 |
| 2021/0066254 A1* | 3/2021 | Yu | H01L 24/19 |
| 2021/0066255 A1* | 3/2021 | Chen | H01L 21/565 |
| 2021/0249380 A1* | 8/2021 | Chen | H01L 25/105 |
| 2021/0305209 A1* | 9/2021 | Chen | H01L 24/80 |
| 2021/0335726 A1* | 10/2021 | Wu | H01L 23/49816 |

\* cited by examiner

*Primary Examiner* — Scott B Geyer
(74) *Attorney, Agent, or Firm* — Slater Matsil, LLP

(57) ABSTRACT

In an embodiment, a method includes forming a device layer over a first substrate; forming a first interconnect structure over a front-side of the device layer; attaching a second substrate to the first interconnect structure; forming a second interconnect structure over a back-side of the device layer, the second interconnect structure comprising back-side memory elements, wherein the back-side memory elements and a first plurality of active devices of the device layer provide a first memory array; and forming conductive connectors over the second interconnect structure.

20 Claims, 19 Drawing Sheets

INTEGRATED CIRCUIT PACKAGE AND METHOD OF FORMING SAME

CROSS REFERENCE TO RELATED APPLICATIONS

This application claims the benefit of U.S. Provisional Application No. 63/275,534, filed on Nov. 4, 2021 and entitled "Integrated Circuit Package and Method of Forming Same," which application is hereby incorporated herein by reference.

BACKGROUND

Since the development of the integrated circuit (IC), the semiconductor industry has experienced continued rapid growth due to continuous improvements in the integration density of various electronic components (i.e., transistors, diodes, resistors, capacitors, etc.). For the most part, these improvements in integration density have come from repeated reductions in minimum feature size, which allows more components to be integrated into a given area.

These integration improvements are essentially two-dimensional (2D) in nature, in that the area occupied by the integrated components is essentially on the surface of the semiconductor wafer. The increased density and corresponding decrease in area of the integrated circuit has generally surpassed the ability to bond an integrated circuit chip onto a substrate. Interposers have been used to redistribute ball contact areas from that of the chip to a larger area of the interposer. Further, interposers have allowed for a three-dimensional package that includes multiple chips. Other packages have also been developed to incorporate three-dimensional aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
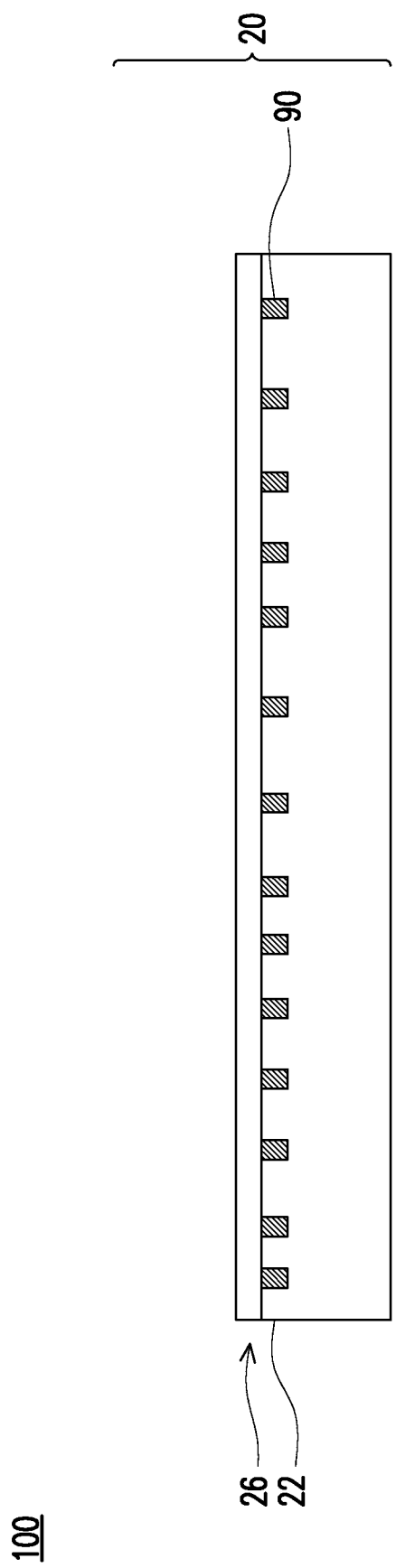
FIGS. 1, 2, 3, 4, 5, 6A, 6B, 7, and 8 are cross-sectional views of intermediate steps during processes for forming an integrated circuit package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, an integrated circuit package may be formed by fabricating active devices and circuit elements (e.g., conductive features and memory elements) on a first side as a first portion of a first integrated circuit device, attaching a carrier substrate or a second integrated circuit device to the first portion of the first integrated circuit device, and fabricating circuit elements (e.g., conductive features and memory elements) on a second side as a second portion of the first integrated circuit device. For example, a front-side portion of the first integrated circuit device may be fabricated by forming a device layer over a substrate and forming a front-side interconnect structure over the device layer. Devices and conductive features in the front-side interconnect structure and the device layer may together form a memory array, such as a front-side non-volatile memory (NVM) array. After attaching the carrier substrate or the second integrated circuit device, the structure may be flipped over to fabricate a back-side portion of the first integrated circuit device, which may include a back-side power delivery network (PDN). Similarly as the front-side interconnect structure, devices and conductive features in the back-side interconnect structure and the device layer may together form another memory array, such as a back-side NVM array. As a result, the first integrated circuit device may balance the front-side and back-side NVM arrays by giving about equal weights or by giving one greater weight than the other. The flexibility in balancing and weighting the front-side and back-side interconnect structures improves performance of the integrated circuit package, for example, by factoring in whether the second integrated circuit device is similar technology or legacy technology and whether the second integrated circuit device is a memory device or a different type of device.

FIG. 1 is a cross-sectional view of a first integrated circuit device 20 comprising a substrate 22 and a device layer 26 in an intermediate step in the formation of a first integrated circuit package 100. Individual or multiple first integrated circuit devices 20 may be packaged in subsequent processing to form the first integrated circuit package 100. In an embodiment, the first integrated circuit package 100 comprises a chip-on-wafer (CoW) package, although it should be appreciated that embodiments may be applied to other three-dimensional integrated circuit (3DIC) packages.

The substrate 22 of the first integrated circuit device 20 may be part of a wafer and comprise a semiconductor substrate of silicon, doped or undoped, an active layer of a semiconductor-on-insulator (SOI) substrate, a multi-layered semiconductor substrate, or the like. The semiconductor substrate may include other semiconductor materials, such as germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as multi-layered or gradient substrates, may also be used. The substrate 22 has an active surface (e.g., the surface facing upward or the front-side surface) and an inactive surface (e.g., the surface facing downward or the back-side surface). Devices (also not separately illustrated) in a device layer 26 discussed below are at the active surface of the substrate 22. The devices may be active and passive devices, including transistors, diodes, capacitors, resistors, and the like. The inactive surface may be free of devices.

In accordance with some embodiments, through vias, such as through silicon vias (TSVs) 90 (e.g., nano-TSVs and/or micro-TSVs), are formed in the front-side of the substrate 22. The TSVs 90 may be formed to extend partially through the substrate 22 and later be exposed from the back-side of the substrate during subsequent processing steps. The TSVs 90 may be formed through the substrate 22 using any suitable process. For example, recesses may be formed in the substrate 22 by etching, milling, laser techniques, a combination thereof, and/or the like. A thin dielectric material may be formed in the recesses, such as by using an oxidation technique. A thin barrier layer may be conformally deposited in the openings, such as by CVD, atomic layer deposition (ALD), physical vapor deposition (PVD), thermal oxidation, a combination thereof, and/or the like. The barrier layer may be formed from an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the substrate 22 by, for example, a CMP. Remaining portions of the barrier layer and conductive material form the TSVs 90.

In some embodiments, some or all of the TSVs 90 may be formed through portions of the substrate 22 before forming the device layer 26 by a via-first process. In some embodiments, others or all of the TSVs 90 may be formed through the device layer 26 and portions of the substrate 22 before forming interconnect structures (see, e.g., front-side interconnect structure 30 in FIG. 2) by a via-middle process. In some embodiments, others or all of the TSVs 90 may be formed after interconnect structures by a via-last process. The TSVs 90 may include any combinations of the above-described embodiments.

The device layer 26 comprises devices formed over and in the substrate 22. For example, the device layer 26 may comprise active and passive devices such as transistors, capacitors, resistors, diodes, and the like, formed in and/or on the active surface of the substrate 22. As a result of the devices formed over and in the device layer 26 as well as the subsequent processing, each completed first integrated circuit package 100 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or combinations thereof (e.g., a system-on-a-chip (SoC) die). The first integrated circuit device 20 may be formed in a wafer, which may include different device regions that are singulated in subsequent steps to form a plurality of the first integrated circuit devices 20. Although not specifically illustrated, contacts to the devices in the device layer 26 may be formed through topmost dielectric layers. For example, gate contacts may be formed to gate electrodes of transistors, and source/drain contacts may be formed to source/drain regions of the transistors. In addition, some devices in the device layer 26 may be formed over and electrically connected to some of the underlying TSVs 90. For example, source/drain regions or transistors of those devices may be electrically connected to the TSVs 90.

Figure 2:
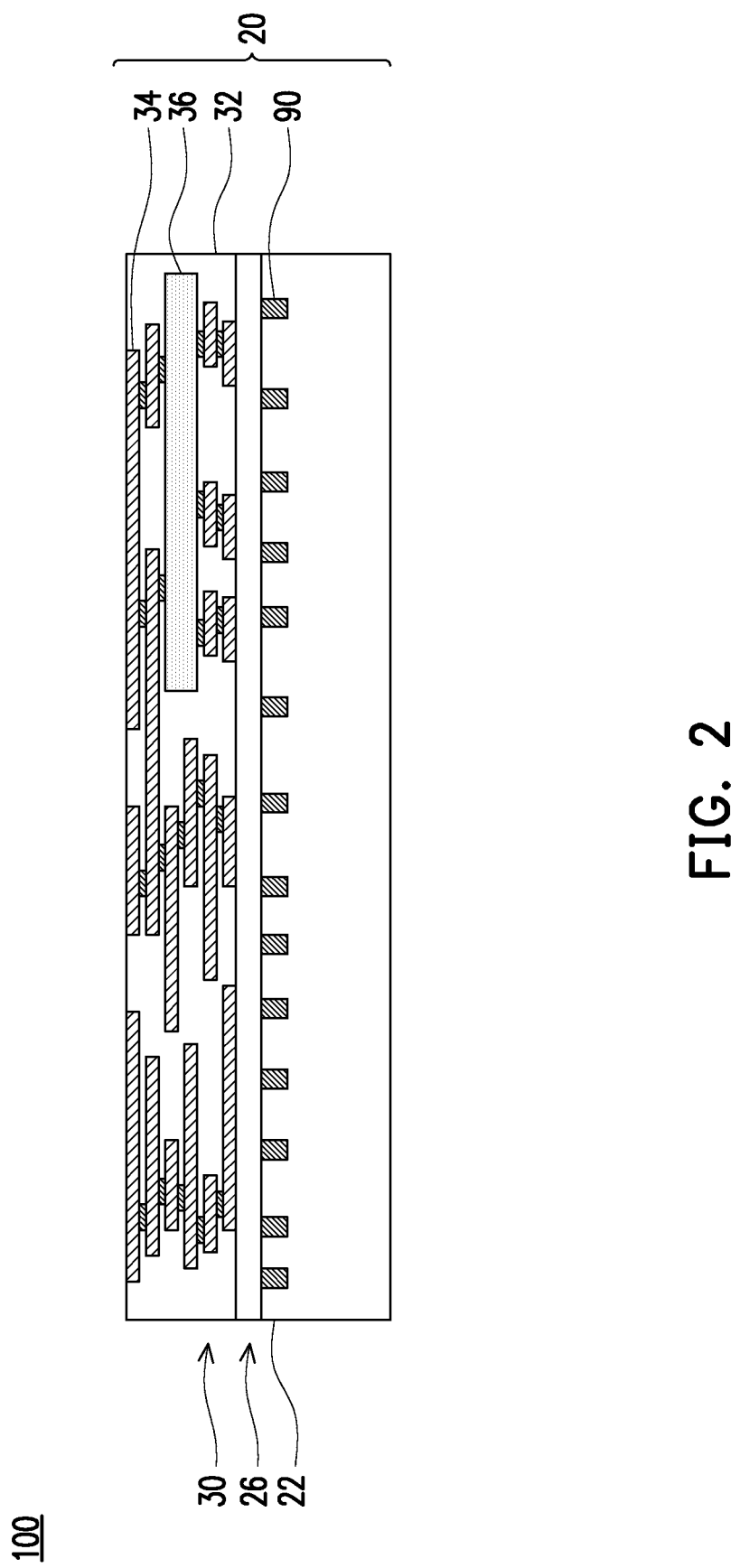

FIG. 2 is a cross-sectional view of a front-side interconnect structure 30 formed over a front-side of the device layer 26 in an intermediate step in the formation of the first integrated circuit device 20 of the first integrated circuit package 100. The front-side interconnect structure 30 may include one or more first dielectric layers 32 and one or more layers of first conductive features 34 forming respective metallization patterns in the first dielectric layers 32. The front-side interconnect structure 30 electrically connects the devices of the device layer 26 to form an integrated circuit.

In addition, the front-side interconnect structure 30 may include front-side memory elements 36 (not individually illustrated) electrically connected to certain devices in the device layer 26 to form a front-side memory array. The front-side memory elements 36 may include some of the first conductive features 34 as well as one or more other types of devices (e.g., capacitors, resistors, diodes, inductors, transmission lines, and/or the like). For example, the contacts discussed above (e.g., the gate contacts and the source/drain contacts) may electrically connect the front-side interconnect structure 30 (e.g., the first conductive features 34 and the front-side memory elements 36) to the devices in the device layer 26. The memory elements 36 may include conductive components, dielectric components, and/or components with variable conductivity. The memory elements 36 may be formed simultaneously with the first conductive features 34 and/or the first dielectric layers 32, respectively. In some embodiments, various components of the memory elements 36 are formed separately from the first conductive features 34 and the first dielectric layers 32.

As discussed above, the integrated circuit formed by the device layer 26 and the front-side interconnect structure 30 may include memory devices. In accordance with some embodiments, the front-side memory array (e.g., the front-side memory elements 36 and corresponding devices in the device layer 26) provides a non-volatile memory array. For example, semiconductor memories include two major categories-volatile memories and non-volatile memories (NVMs). Volatile memories include random access memory (RAM), which can be further divided into two sub-categories-static random access memory (SRAM) and dynamic random access memory (DRAM). Both SRAM and DRAM are volatile because they will lose the information they store when they are not powered. On the other hand, non-volatile memories can retain data stored on them when they are not powered. In various embodiments, the non-volatile memory array may be a resistive random access memory (RRAM or ReRAM) array, a magnetoresistive random access memory (MRAM) array, a phase change random access memory (PCRAM) array, a ferroelectric random access memory (FeRAM) array, the like, or any combination thereof.

In various embodiments, when the front-side memory array is a RRAM array, the memory elements may include memory resistors, which include a material whose resistance varies when different voltages are imposed across it. Each memory resistor may include a dielectric material, which when subjected to a high enough voltage may suddenly conduct (e.g., transition to a low resistance state) because of a phenomenon called dielectric breakdown. The dielectric material may also be switchable and stop conducting (e.g., return to a high resistance state) through the application of a different voltage. Thus, bits may be stored depending on a resistance state (e.g., high or low) of each of the memory elements. In such embodiments, the memory elements 36 may be formed of or comprise a metal-containing high-k dielectric material (e.g., a transition metal oxide) that may be disposed between two electrodes. The electrodes may be used to apply an appropriate voltage across the high-k dielectric material. In some embodiments, the high-k dielectric material of the memory elements 36 comprises $HfO_x$, $ZrO_x$, $TaO_x$, $TiO_x$, $VO_x$, $NiO_x$, $NbO_x$, $LaO_x$, the like, or a combination thereof. In other embodiments, the high-k dielectric material of the memory elements 36 comprises $AlO_x$, $SnO_x$, $GdO_x$, IGZO, $Ag_2S$, the like, or a combination thereof. In other embodiments, the high-k dielectric material of the memory elements 36 comprise a chalcogenide material such as $GeS_2$, GeSe, AgGeSe, GeSbTe, doped GeSbTe (e.g., doped with N, Si, C, Ga, In, the like, or a combination thereof), the like, or a combination thereof. These are examples, and other resistive-type memories, other RRAM materials, or combinations of materials, are possible, and all are also considered within the scope of the present disclosure.

In accordance with some embodiments, when the front-side memory array is a MRAM array, the memory elements 36 may include magnetic materials and devices. The spins of electrons, through their magnetic moments, are used to store bits. The memory elements 36 (e.g., a MRAM cell) include a magnetic tunnel junction (MTJ) stack, which may be a multilayer structure, and at least includes a free layer, a reference layer, and a barrier layer sandwiched between the free layer and the reference layer. In some embodiments, the free layer and the reference layer respectively include at least one ferromagnetic layer, while the barrier layer includes at least one insulating layer. A magnetization direction of the reference layer is pinned, and a magnetization direction of the free layer can be altered by, for example, the spin Hall effect. When the magnetization directions of the free layer and the reference layer are in the parallel state, the MTJ is in the low electrical resistance state. On the other hand, when the magnetization directions of the free layer and the reference layer are in the anti-parallel state, the MTJ is in the high electrical resistance state. In addition, the insulating barrier layer provides isolation between the free layer and the reference layer, while being thin enough to be tunneled through by, for example, a read current. In some embodiments, the free layer is formed of a CoFeB alloy, a CoPd alloy, a CoFe alloy, a CoFeBW alloy, a NiFe alloy, ruthenium, the like, or combinations thereof. In some embodiments, the reference layer is formed of the CoFeB alloy. Moreover, in some embodiments, the barrier layer is formed of magnesium oxide, aluminum oxide, aluminum nitride, the like, or combinations thereof. These are examples, and other suitable materials for the free layer, the reference layer, and the barrier layer according to design or process requirements are also considered within the scope of the present disclosure.

In some embodiments, when the front-side memory array is a PCRAM array, the memory elements 36 may include memory resistors, which include a material whose resistance varies based on whether it is in a crystalline or amorphous state. For example, in the amorphous state (e.g., disordered phase), the material has high electrical resistance. And in the crystalline state (e.g., ordered phase), the material has less electrical resistance. Thus, bits may be stored depending on a resistance state (e.g., high or low). In some embodiments, heat produced by the passage of an electric current through a heating element (e.g., generally made of titanium nitride) may be used to either quickly heat and quench the material to either make the material amorphous or to hold the material in its crystallization temperature range for some time, thereby switching it to a crystalline state. As such, the memory elements 36 may also have the ability to achieve a number of distinct intermediary states, thereby providing the ability to hold multiple bits in a single cell. In accordance with some embodiments, the material may be a chalcogenide (e.g., materials described above with respect to a PCRAM array, a RRAM array, a FeRAM array, the like, or a combination thereof). In other embodiments, the material may be capable of non-thermal phase changes, such as a $GeTe$—$Sb_2Te_3$ superlattice, which may be achieved by simply changing the co-ordination state of the germanium atoms using a laser pulse.

In various embodiments, when the front-side memory array is a FERAM array, the memory elements 36 may include memory resistors, which include a material whose resistance varies based on its polarization. For example, the material may switch between two different polarizations due to application of an electric field resulting from applying a voltage differential across the material. Thus, bits may be stored depending on the resistance state (e.g., based on which polarization direction is generated). In some embodiments, the material of the memory elements 36 may be a high-k dielectric material, such as a hafnium (Hf) based dielectric material, or the like. In some embodiments, the material comprises a ferroelectric material, such as hafnium oxide, hafnium zirconium oxide, silicon-doped hafnium oxide, lead zirconate titanate (PZT), or the like.

As discussed above, the memory elements 36 may include components (e.g., conductive components, dielectric components, and/or components of variable conductivity) formed simultaneously with the first dielectric layers 32 and/or the first conductive features 34. Even if not formed simultaneously, some components of the memory elements 36 may be formed similarly as the first dielectric layers 32 and/or the first conductive features 34. As such, for the sake of simplicity, discussion relating to the first dielectric layers 32 and the first conductive features 34 (e.g., materials or formation) may further relate to components of the memory elements 36 where applicable.

Acceptable dielectric materials for the first dielectric layers 32 include a low-k dielectric material, an extra low-k (ELK) dielectric material, or the like. For example, the first dielectric layers 32 may comprise oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The first dielectric layers 32 and some dielectric components of the memory elements 36 may be deposited using an appropriate process, such as CVD, ALD, PVD, PECVD, or the like.

The first conductive features 34 of the metallization patterns may include conductive lines and conductive vias interconnecting the layers of conductive lines. For example, the conductive vias may extend through respective ones of the first dielectric layers 32 to provide vertical connections between layers of the conductive lines. The first conductive features 34 may be formed of a conductive material, such as a metal, such as copper, cobalt, aluminum, gold, combinations thereof, or the like. The front-side interconnect structure 30 may be formed by a damascene process, such as a single damascene process, a dual damascene process, combinations thereof, or the like.

In some embodiments, the first conductive features 34 and some components of the front-side memory elements 36 (e.g., conductive, dielectric, and/or variably conductive components) may be formed using a damascene process. For example, a respective first dielectric layer 32 is patterned utilizing a combination of photolithography and etching techniques to form trenches corresponding to the desired pattern of the first conductive features 34. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the first conductive features 34 may be formed by depositing a seed layer of copper or a copper alloy, and filling the trenches by electroplating. A chemical mechanical planarization (CMP) process or the like may be used to remove excess conductive material from a surface of the respective first dielectric layer 32 and to planarize surfaces of the first dielectric layer 32 and the first conductive features 34 for subsequent processing.

While FIG. 2 illustrates about six layers of the first conductive features 34 in the front-side interconnect structure 30, it should be appreciated that the front-side interconnect structure 30 may comprise any number of layers of the first conductive features 34 disposed in any number of the first dielectric layers 32. As discussed above, the front-side interconnect structure 30 may be electrically connected to, for example, the gate contacts and the source/drain contacts to form functional integrated circuits. In some embodiments, the functional integrated circuits formed by the front-side interconnect structure 30 may comprise logic circuits, memory circuits, image sensor circuits, or the like. For example, the memory elements 36 may be connected to active devices through the gate contacts and the source/drain contacts, and the active devices may provide access transistors for reading/writing to the memory elements 36. Although a top surface of the front-side interconnect structure 30 is illustrated as being substantially flat, the top surface of the front-side interconnect structure 30 may be nonplanar due to unevenness from a topmost layer of the first conductive features 34 formed in the first dielectric layers 32.

Figure 3:
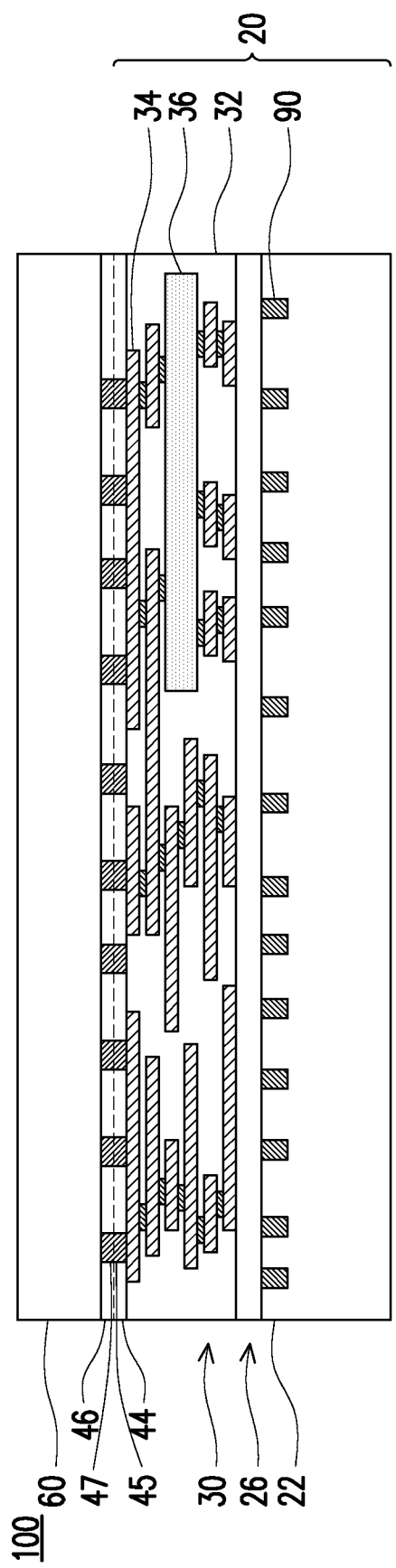

In FIG. 3, a carrier wafer 60 is attached to the first integrated circuit device 20. The carrier wafer 90 may be a glass carrier substrate, a ceramic carrier substrate, a wafer (e.g., a silicon wafer), or the like. The carrier wafer 90 may provide structural support during subsequent processing steps and in the completed integrated circuit package 100. The carrier wafer 60 may be attached using a hybrid bonding method, wherein dielectric layers (e.g., bonding layers) and conductive materials are first formed over the first integrated circuit device 20 and over the carrier wafer 60, and the carrier wafer 60 is then pressed against the first integrated circuit device 20 with the corresponding dielectric and conductive materials aligned.

For example, a first bonding layer 44 is formed over the first integrated circuit device 20. The first bonding layer 44 may comprise a dielectric material, including an oxide such as silicon oxide ($SiO_x$), silicon nitride, silicon oxynitride, or the like, and may be deposited by CVD (e.g., HDP), ALD, PVD, or the like. Other suitable materials and/or processes may be used to form the first bonding layer 44. The first bonding layer 44 may be deposited using a CVD process, such as HDP-CVD, or any suitable technique. Recesses are then formed through the first bonding layer 44 to expose some or all of the first conductive features 34 of the front-side interconnect structure 30. Second conductive features 45 are formed in the recesses. The second conductive features 45 are each electrically connected to a respective underlying first conductive feature 34. The second conductive features 45 may therefore be electrically connected to devices in the device layer 26 through the front-side interconnect structure 30. The second conductive features 45 may each comprise one or more layers, such as barrier layers, diffusion layers, and conductive fill materials. For example, in some embodiments, the second conductive features 45 each include a barrier layer and a conductive fill material. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from the top surface of the first bonding layer 44. Following the planarization, the second conductive features 45 and the first bonding layer 44 are level.

A second bonding layer 46 and third conductive features 47 may be formed over the carrier wafer 60 using the methods and materials described above in connection with the first bonding layer 44 and the second conductive features 45. In some embodiments, the second bonding layer 46 and the third conductive features 47 may be formed using either same or different methods and/or materials as forming the first bonding layer 44 and the second conductive features 45. In other embodiments, the second bonding layer 46 and the third conductive features 47 may have already been formed over the carrier wafer 60 before beginning formation of the first integrated circuit package 100 as described above.

The carrier wafer 60 and the first integrated circuit device 20 are bonded in a face-to-face manner by hybrid bonding, such that a front-side surface of the carrier wafer 60 (e.g., the third conductive features 47 and the second bonding layer 46) is bonded to the first integrated circuit device 20 (e.g., the second conductive features 45 and the first bonding layer 44). Specifically, the second bonding layer 46 along the carrier wafer 60 is bonded to the first bonding layer 44 along the first integrated circuit device 20 through dielectric-to-dielectric bonding, without using any adhesive material (e.g., die attach film). Similarly, the third conductive features 47 along the carrier wafer 60 are bonded to the second conductive features 45 along the first integrated circuit device 20 through metal-to-metal bonding, without using any eutectic material (e.g., solder).

The bonding may include a pre-bonding and an annealing. During the pre-bonding, a small pressing force is applied to press the carrier wafer 60 against the first integrated circuit device 20. The pre-bonding is performed at a low temperature, such as room temperature, such as a temperature in the range of about 15° C. to about 30° C. and after the pre-bonding, the second bonding layer 46 and the first bonding layer 44 are bonded to each other. The bonding strength is then improved in a subsequent annealing step, in which the second bonding layer 46 and the first bonding layer 44 are annealed at an elevated temperature, such as a temperature in the range of about 100° C. to about 450° C. After the annealing, bonds, such as fusions bonds, are formed bonding the second bonding layer 46 with the first bonding layer 44. For example, the bonds may include covalent bonds between the material of the second bonding layer 46 and the material of the first bonding layer 44. The second conductive features 45 and the third conductive features 47 are connected to each other in a one-to-one correspondence. The second conductive features 45 and the third conductive features 47 may be in physical contact after the pre-bonding, or may expand to be brought into physical contact during the annealing. Further, during the annealing, the material of the second conductive features 45 and the third conductive features 47 (e.g., copper) intermingles, so that metal-to-metal bonds are also formed. Hence, the resulting bonds attaching the first integrated circuit device 20 to the carrier wafer 60 are hybrid bonds that include both dielectric-to-dielectric bonds and metal-to-metal bonds. As a result, the first bonding layer 44, the second conductive features 45, the second bonding layer 46, and the third conductive features 47 may collectively be referred to as a hybrid bonding layer.

In other embodiments not specifically illustrated, the carrier wafer 60 may be bonded to the first integrated circuit device 20 using any other suitable technique, such as dielectric-to-dielectric bonding, or the like. For example, the dielectric-to-dielectric bonding may be performed without forming the second conductive features 45 in the first bonding layer 44 and the third conductive features 47 in the second bonding layer 46. The first bonding layer 44 and the second bonding layer 46 may comprise oxides (e.g., silicon oxide or the like) that are deposited by CVD (e.g., HDP), ALD, PVD, thermal oxidation, combinations thereof, or the like. Other suitable materials and/or processes may be used to form the first bonding layer 44 and the second bonding layer 46.

The dielectric-to-dielectric bonding process may further include applying a surface treatment to one or more of the first bonding layer 44 and the second bonding layer 46. For example, the surface treatment may include a plasma treatment performed in a vacuum environment. After the plasma treatment, the surface treatment may further include a cleaning process (e.g., a rinse with deionized water or the like) that may be applied to one or more of the first bonding layer 44 and the second bonding layer 46. The carrier wafer 60 is then aligned with the first integrated circuit device 20, and the two are pressed against each other to initiate a pre-bonding of the second bonding layer 46 to the first bonding layer 44. For example, a push pin may extend through a carrier wafer chuck to warp or bend a center region of the carrier wafer 60. By warping the carrier wafer 60, physical contact is initially made between a center region of the second bonding layer 46 along the carrier wafer 60 and the first bonding layer 44 before allowing respective outer regions of the second bonding layer 46 and the first bonding layer 44 to physically contact and bond with one another. The carrier wafer chuck may then be moved further downward to bond a growing concentric circle of the second bonding layer 46 to the first bonding layer 44 until edges of the respective outer regions meet and are bonded together. In some embodiments, the bonding process allows for any dangling bonds along the surface of the first bonding layer 44 to form chemical bonds with atoms or molecules along the surface of the second bonding layer 46, and/or vice versa. As a result, a bonded interface is formed between the first bonding layer 44 and the second bonding layer 46.

Figure 4:
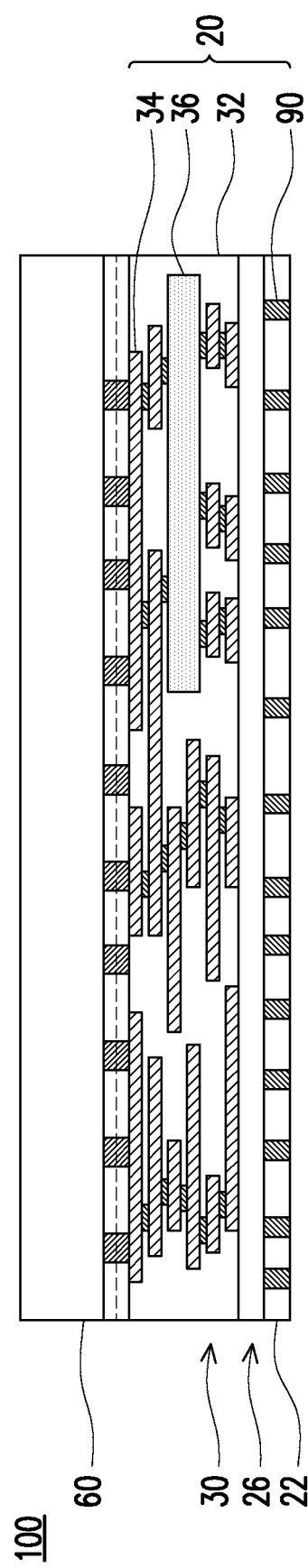

In FIG. 4, the TSVs 90 are exposed from the back-side of the substrate 22. Although not specifically illustrated, the intermediate structure is flipped over to expose the TSVs 90 and for other subsequent processing. For example, the substrate 22 may undergo one or more partial removal processes, such as a thinning process, including a grinding process, a CMP, an etch-back, combinations thereof, or the like.

In other embodiments not specifically illustrated, the TSVs 90 (or some of the TSVs 90) may be formed through the substrate 22 after forming the front-side interconnect structure 30 and attaching the carrier wafer 60, such as in a via-last process. For example, after attaching the carrier wafer 60 and flipping over the structure, a grinding process or CMP is performed to remove some or a majority of the substrate 22. In some embodiments, one or more suitable etching processes are then performed to form openings in the substrate 22 to expose certain portions of the devices in the device layer 26. Similarly as described above in connection with FIG. 1, the openings may be filled with a conductive material, and the resulting TSVs 90 may be electrically connected to the devices in the device layer 26. For example, the TSVs 90 may be electrically connected to the source/drain regions of transistors in the device layer 26. In some embodiments, some of the TSVs 90 are electrically connected to the gates of the transistors in the device layer 26.

For example, a thin barrier layer may be conformally deposited in the openings, such as by CVD, atomic layer deposition (ALD), physical vapor deposition (PVD), thermal oxidation, a combination thereof, and/or the like. The barrier layer may be formed from an oxide, a nitride, a carbide, combinations thereof, or the like. A conductive material may be deposited over the barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from a surface of the substrate 22 by, for example, a CMP. Remaining portions of the barrier layer and conductive material form the TSVs 90.

Figure 5:
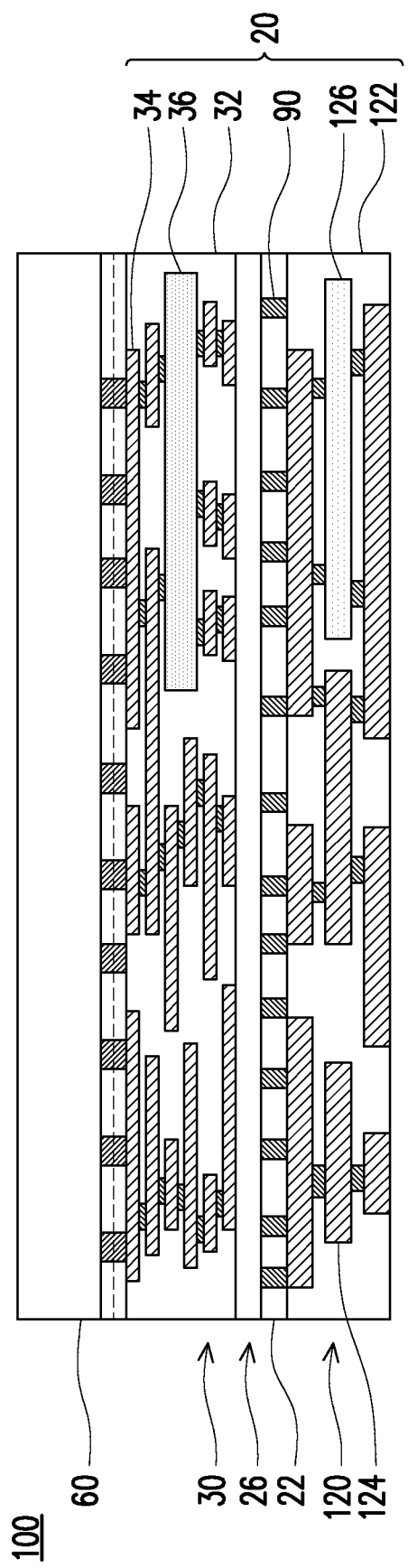

In FIG. 5, a back-side interconnect structure 120 is formed over a back-side of the device layer 26 and over the TSVs 90 disposed over the back-side of the device layer 26. The back-side interconnect structure 120 may be referred to as a back-side interconnect structure because it is formed on a back-side of the devices (e.g., transistor structures) in the device layer 26. The TSVs 90 are electrically and physically interposed between the devices in the device layer 26 and the back-side interconnect structure 120. The back-side interconnect structure 120 may be formed with similar materials and similar processes as described above in connection with the front-side interconnect structure 30.

For example, the back-side interconnect structure 120 may comprise one or more layers of fourth conductive features 124 formed in one or more stacked second dielectric layers 122. In some embodiments, the back-side interconnect structure 120 includes a back-side power delivery network to provide the means of delivering power and other external connectivity to the integrated circuit. Similarly as with the front-side interconnect structure 30, the back-side interconnect structure 120 may include back-side memory elements 126 (not individually illustrated) electrically connected to certain devices in the device layer 26, through the TSVs 90, to form a back-side memory array. In accordance with some embodiments, the back-side memory array (e.g., the back-side memory elements 126, corresponding devices in the device layer 26, and corresponding ones of the TSVs 90) provides a non-volatile memory array. For example, the TSVs 90 may electrically connect the back-side interconnect structure 120 (e.g., the fourth conductive features 124 and the back-side memory elements 126) to the devices in the device layer 26. The back-side memory elements 126 may include some of the fourth conductive features 124 as well as one or more other types of devices (e.g., capacitors, resistors, diodes, inductors, power lines, and/or the like). The memory elements 126 may include conductive components, dielectric components, and/or components with variable conductivity. The memory elements 126 may be formed simultaneously with the fourth conductive features 124 and/or the second dielectric layers 122, respectively. In some embodiments, various components of the memory elements 126 are formed separately from the fourth conductive features 124 and the second dielectric layers 122.

Similarly as with the front-side memory array, the back-side memory array includes the integrated circuit formed by the device layer 26 and memory devices formed in the back-side interconnect structure 120. In accordance with some embodiments, the back-side memory array (e.g., the back-side memory elements 126 and corresponding devices in the device layer 26) is a non-volatile memory. The non-volatile memory may include RRAM, MRAM, PCRAM, FeRAM, the like, or combinations thereof. The back-side memory array may include the same type or a different type of non-volatile memory as compared to the front-side memory array.

Similarly as discussed above in connection with the memory elements 36, the memory elements 126 may include components (e.g., conductive components, dielectric components, and/or components of variable conductivity) formed simultaneously with the second dielectric layers 122 and/or the fourth conductive features 124. Even if not formed simultaneously, some components of the memory elements 126 may be formed similarly as the second dielectric layers 122 and/or the fourth conductive features 124. As such, for the sake of simplicity, discussion relating to the second dielectric layers 122 and the fourth conductive features 124 (e.g., materials or formation) may further relate to components of the memory elements 126 where applicable.

Acceptable dielectric materials for the second dielectric layers 122 include a low-k dielectric material, an extra low-k (ELK) dielectric material, or the like. For example, the second dielectric layers 122 may comprise oxides such as silicon oxide or aluminum oxide; nitrides such as silicon nitride; carbides such as silicon carbide; the like; or combinations thereof such as silicon oxynitride, silicon oxycarbide, silicon carbonitride, silicon oxycarbonitride or the like. Other dielectric materials may also be used, such as a polymer such as polybenzoxazole (PBO), polyimide, a benzocyclobuten (BCB) based polymer, or the like. The second dielectric layers 122 may be deposited using an appropriate process, such as CVD, ALD, PVD, PECVD, or the like.

The fourth conductive features 124 of the back-side interconnect structure 120 comprise conductive lines and conductive vias that interconnect neighboring layers of the conductive lines. The conductive vias may extend through respective ones of the second dielectric layers 122 to provide vertical connections between the layers of the conductive lines. For example, the conductive vias may couple some of the conductive lines to others of the conductive lines. The fourth conductive features 124, the second dielectric layers 122, and components of the back-side memory elements 126 (e.g., conductive, dielectric, and/or variably conductive components) may be formed using similar processes and similar materials as described above in connection with the first conductive features 34, the first dielectric layers 32, and components of the front-side memory elements 36 (e.g., conductive, dielectric, and/or variably conductive components) of the front-side interconnect structure 30, including single and/or dual damascene processes, through any acceptable process, or the like.

Although FIG. 5 illustrates about three layers of the conductive lines of the fourth conductive features 124 in the back-side interconnect structure 120, it should be appreciated that the back-side interconnect structure 120 may comprise any number of layers of the fourth conductive features 124 disposed in any number of second dielectric layers 122. The back-side interconnect structure 120 may be electrically connected to the backside vias to form functional circuits. In some embodiments, the functional circuits formed by the back-side interconnect structure 120 in conjunction with the front-side interconnect structure 30 may comprise logic circuits, memory circuits, image sensor circuits, or the like.

The front-side memory elements 36 and the back-side memory elements 126 provide greater capacity for the memory arrays (e.g., a total number of memory devices of non-volatile memory) in the first integrated circuit package 100. In addition, utilizing the front-side memory elements 36 in conjunction with the back-side memory elements 126 provides flexibility in balancing respective areas or weightings of the front-side memory array (e.g., an NVM array) and the back-side memory array (e.g., another NVM array). For example, the front-side interconnect structure 30 may dedicate more of the first conductive features 34 to logic computing and intraconnectivity of the integrated circuit (in addition to the front-side memory array), while the back-side interconnect structure 120 containing the back-side memory array shoulders some of the total non-volatile memory capacity. Likewise, the back-side interconnect structure 120 may dedicate more of the fourth conductive features 124 to logic computing, intraconnectivity, and interconnectivity (in addition to the back-side memory array), while the front-side interconnect structure 30 shoulders some of the total non-volatile memory capacity. As a result, efficiency of logic computation and memory allocation may be enhanced.

In some embodiments when it may be advantageous for the front-side interconnect structure 30 to be dedicated to circuitry other than or in addition to NVM purposes, the back-side memory elements 126 of the back-side memory array may occupy a larger area or be weighted more heavily than the front-side memory elements 36 of the front-side memory array. For example, the weighting of the front-side and back-side memory arrays may pertain to the number of the front-side memory elements 36 and the back-side memory elements 126, respectively, as compared with a total number of the memory elements. For example, the weighting of the back-side memory elements 126 may be between about 0% and about 100% of the total number of the memory elements. In some embodiments, almost all NVM may be integrated in the back-side memory elements 126. In other embodiments when it may be advantageous for the front-side interconnect structure to be dedicated to NVM purposes, the front-side memory elements 36 of the front-side memory array may occupy a larger area or be weighted more heavily than the back-side memory elements 126 of the back-side memory array. For example, the weighting of the front-side memory elements 36 may be between about 0% and about 100% of the total number of the memory elements. In some embodiments, almost all NVM may be integrated in the front-side memory elements 36.

Figure 6A:
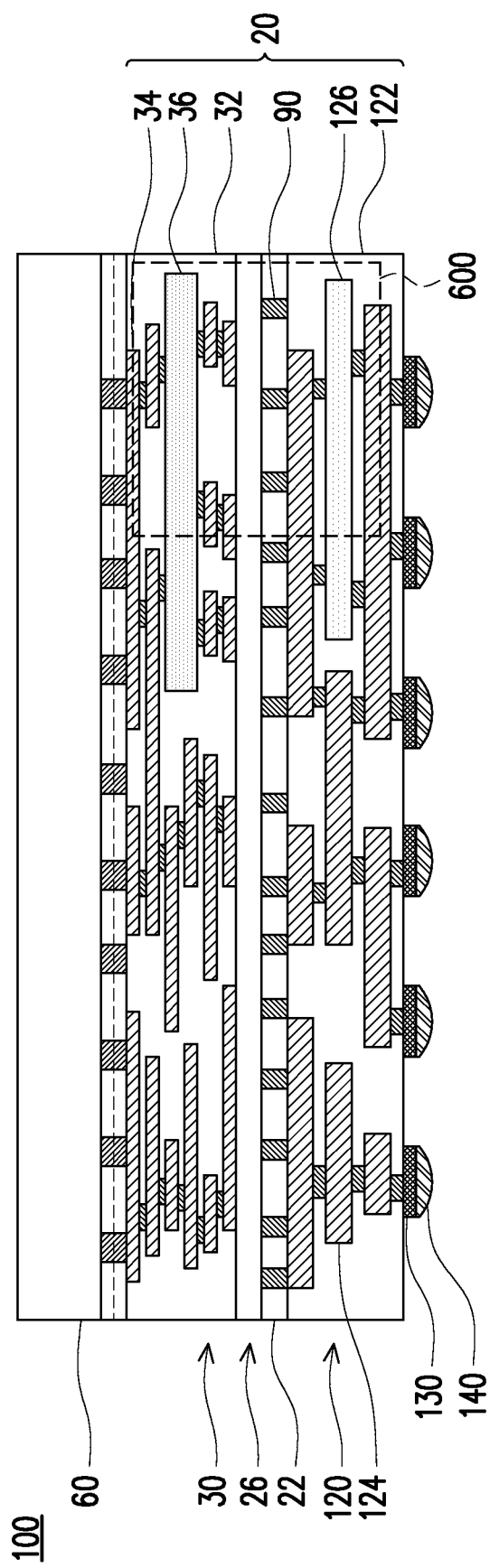

In FIG. 6A, under bump metallurgies (UBMs) 130 and conductive connectors 140 are formed over the back-side interconnect structure 120 (e.g., the fourth conductive features 124 and the second dielectric layers 122) and may be embedded in a dielectric layer (not specifically illustrated). As an example to form the UBMs 130, a seed layer (not specifically illustrated) is formed over the exposed surfaces of the fourth conductive features 124 and the second dielectric layers 122. In some embodiments, the seed layer is a metal layer, which may be a single layer or a composite layer including a plurality of sub-layers formed of different materials. In some embodiments, the seed layer includes a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the UBMs 130. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may include a metal, such as copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process. The remaining portions of the seed layer and conductive material form the UBMs 130. In some embodiments, a dielectric material (not specifically illustrated) may then be formed over the back-side interconnect structure 120 and around the UBMs 130 to embed the UBMs 130 and passivate the back-side interconnect structure 120.

As illustrated, the conductive connectors 140 are formed on the UBMs 130. The conductive connectors 140 (e.g., external connectors) may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 140 may include a conductive material such as solder, copper, aluminum, gold, nickel, silver, palladium, tin, the like, or a combination thereof. In some embodiments, the conductive connectors 140 are formed by initially forming a layer of solder through evaporation, electroplating, printing, solder transfer, ball placement, or the like. Once a layer of solder has been formed on the structure, a reflow may be performed in order to shape the material into desired bump shapes. In another embodiment, the conductive connectors 140 comprise metal pillars (such as copper pillars) formed by sputtering, printing, electro plating, electroless plating, CVD, or the like. The metal pillars may be solder-free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Although not specifically illustrated, in some embodiments, a singulation process may be performed on the first integrated circuit package 100 by cutting along scribe line regions, e.g., between package regions of the carrier wafer 60. The singulation process may include sawing, dicing, or the like. For example, the singulation process can include sawing the third dielectric layer 132, the back-side interconnect structure 120, the device layer 26, the front-side interconnect structure 30, the first bonding layer 44, the second bonding layer 46, and the carrier wafer 60. The singulated first integrated circuit packages 100 may then be attached and utilized with other packages.

Figure 6B:
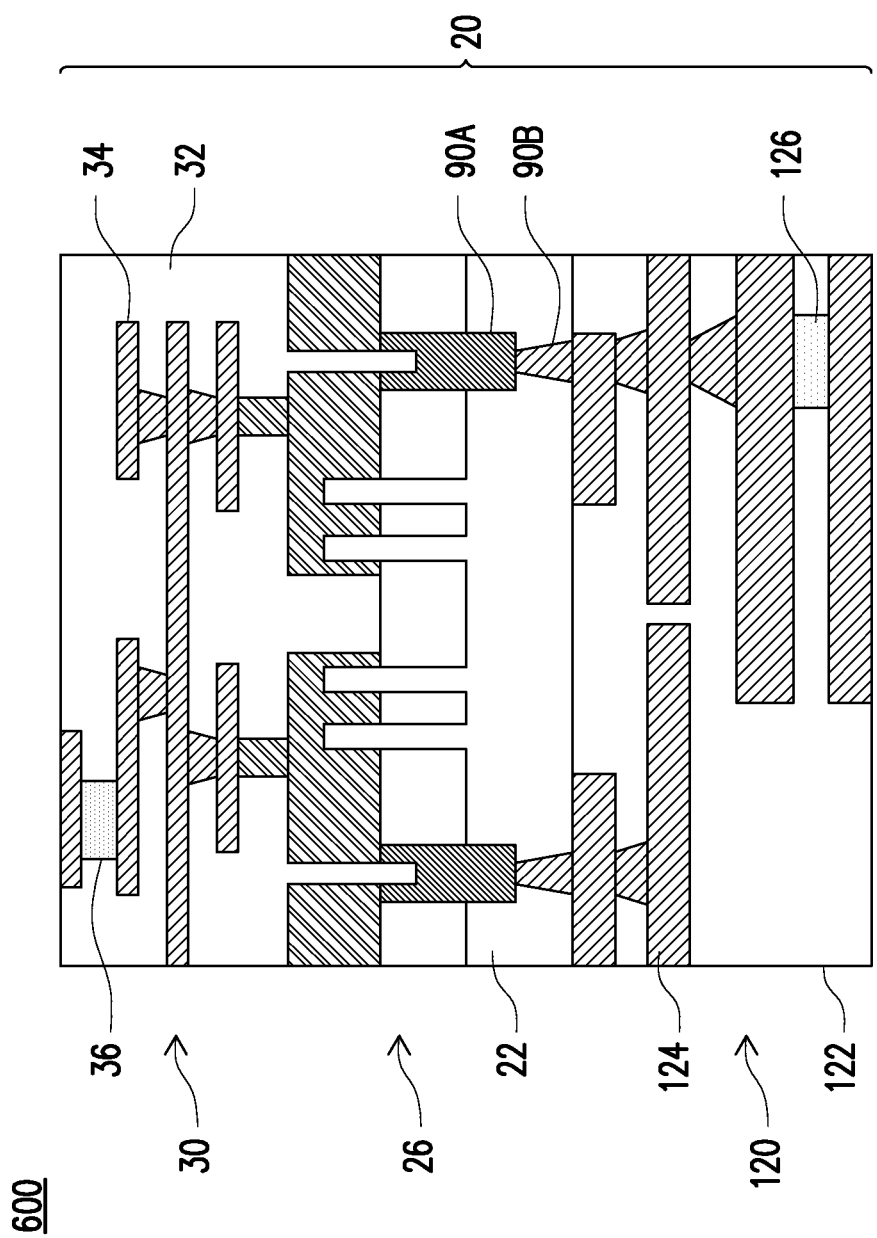

FIG. 6B illustrates an exemplary detailed view of a region 600 (see FIG. 6A). As illustrated, the front-side interconnect structure 30 is formed over the front-side of the substrate 22, and the back-side interconnect structure 120 is formed over the back-side of the substrate 22. The fourth conductive features 124 of the back-side interconnect structure 120 form the power delivery network (PDN) (e.g., including power rails, which provide high throughput current) for power and ground routing through the integrated circuit. The TSVs 90 formed through the substrate 22 may include TSVs 90A formed by, for example, a via-first process as well as TSVs 90B formed by, for example, a via-last process. In some embodiments, the TSVs 90A may be electrically connected and in physical contact with the TSVs 90A, thereby collectively extending through an entirety of the substrate 22. The TSVs 90A may also be referred to as buried rails and may be configured to delivery power or ground voltages to the device layer 26 and/or the front-side interconnect structure 30. The device layer 26 formed over the front-side of the substrate 22 includes transistors comprising channel regions (e.g., semiconductor fins, not separately labeled), gate electrodes (not separately labeled), and source/drain regions (not specifically illustrated). As discussed above, the gate contacts (not separately labeled) may connect the gate electrodes of the transistors to the front-side interconnect structure 30. In addition, the TSVs 90 (e.g., the TSVs 90A and 90B) may connect the gate electrodes of the transistors to the back-side interconnect structure 120.

Further illustrated are portions of the front-side memory elements 36 formed in the first dielectric layers 32 and portions of the back-side memory elements 126 formed in the second dielectric layers 122. Although illustrated as being located at or between third and fourth layers of the first conductive features 34 (in the front-side interconnect structure 30) and the fourth conductive features 124 (in the back-side interconnect structure 120), portions of the front-side memory elements 36 and the back-side memory elements 126 may be located in other layers, such as being more proximal to or more distal from the substrate 22. Note that the substrate 22, the TSVs 90, the device layer 26, the front-side interconnect structure 30, and/or the back-side interconnect structure 120 illustrated in the exemplary detailed view of FIG. 6B may also be applicable to subsequent embodiments containing any of those features, wherever applicable and unless otherwise stated.

Figure 7:
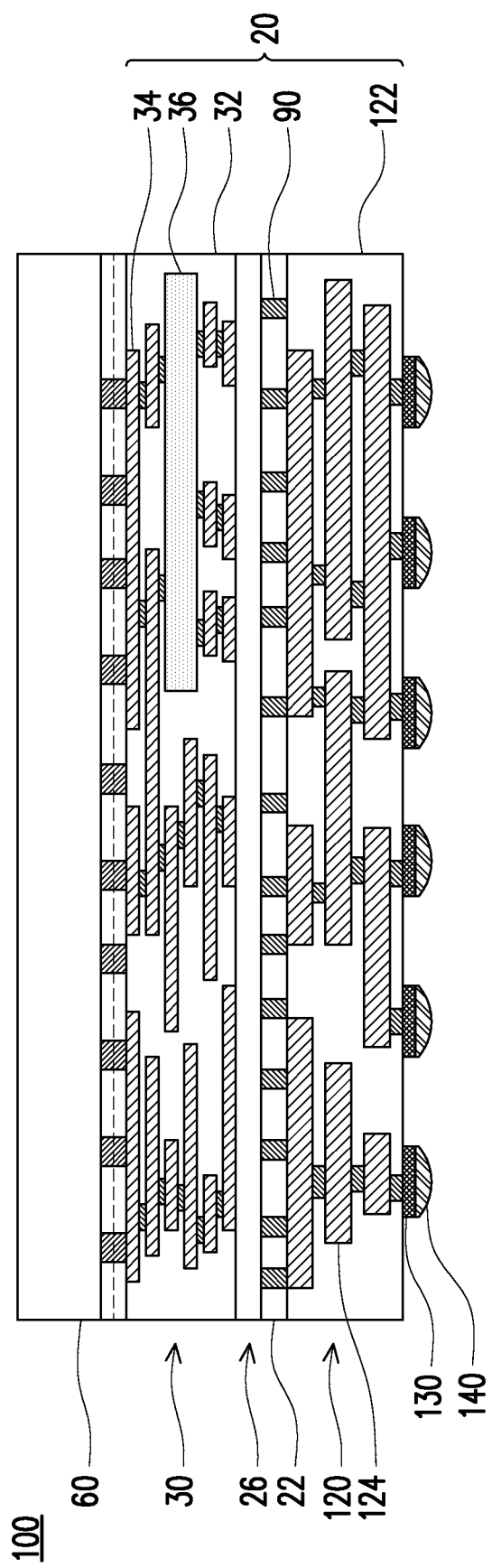

In FIG. 7, in accordance with some embodiments of the first integrated circuit package 100, the back-side interconnect structure 120 may be formed without the back-side memory elements 126 while the front-side interconnect structure 30 is formed with the front-side memory elements 36. For example, the back-side interconnect structure 120 may be utilized for a greater bulk of intraconnectivity among the devices in the device layer 26 and/or interconnectivity of front-side and back-side portions of the integrated circuit with other subsequently attached packages through the conductive connectors 140.

Figure 8:
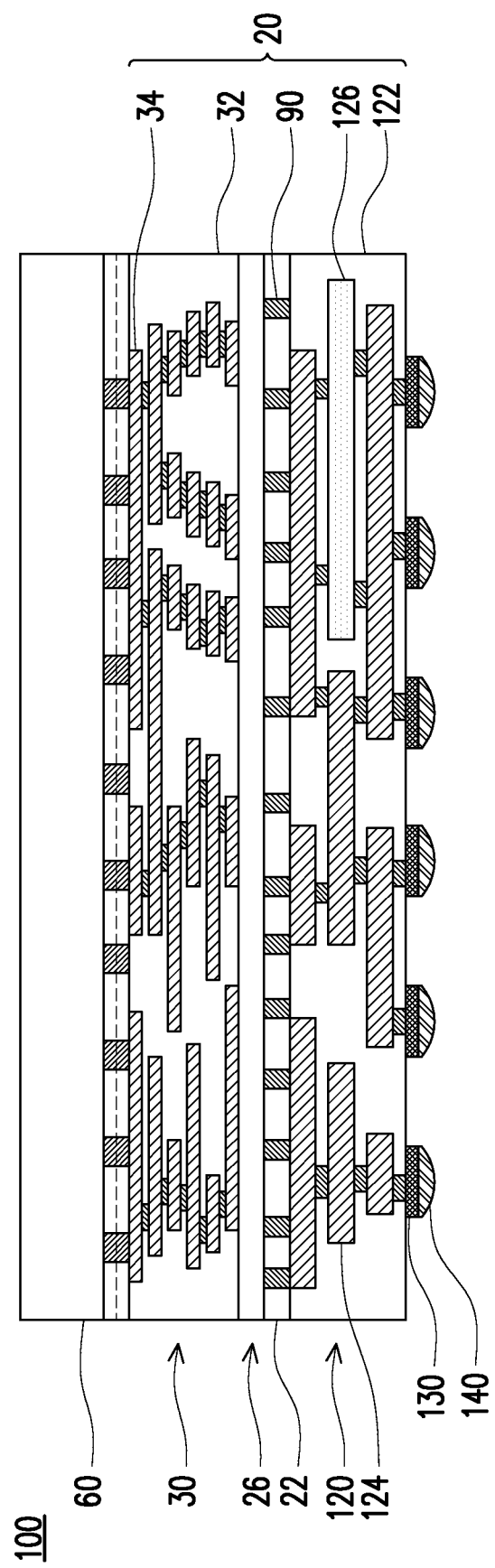

In FIG. 8, in accordance with other embodiments of the first integrated circuit package 100, the front-side interconnect structure 30 may be formed without the front-side memory elements 36 while the back-side interconnect structure 120 is formed with the back-side memory elements 126. For example, the front-side interconnect structure 30 may be utilized for a greater bulk of logic computing and intraconnectivity among the devices in the device layer 26. In addition, the back-side interconnect structure 120 may be able to utilize a greater portion of the fourth conductive features 124 to interconnectivity with other subsequently attached packages through the conductive connectors 140 as well as some intraconnectivity among the devices in the device layer 26 through the TSVs 90.

Figure 9:
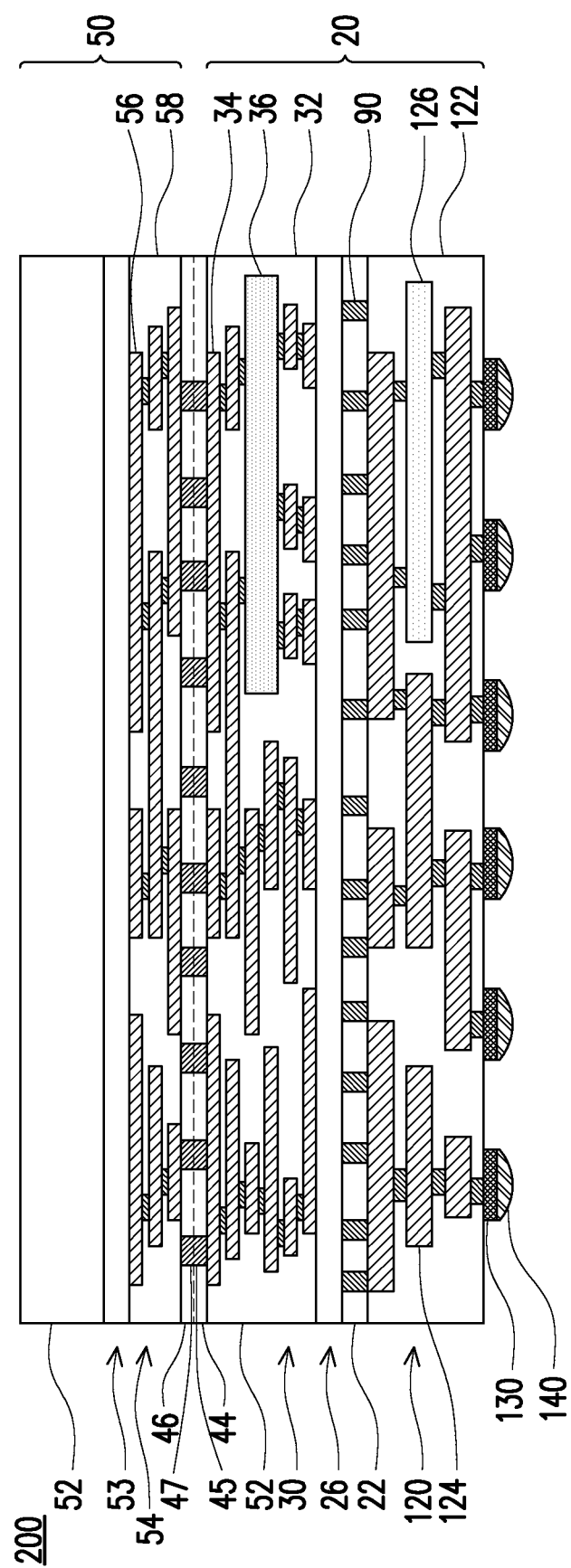
FIGS. 9, 10, and 11 are cross-sectional views of intermediate steps during processes for forming an integrated circuit package, in accordance with some embodiments.
Figure 10:
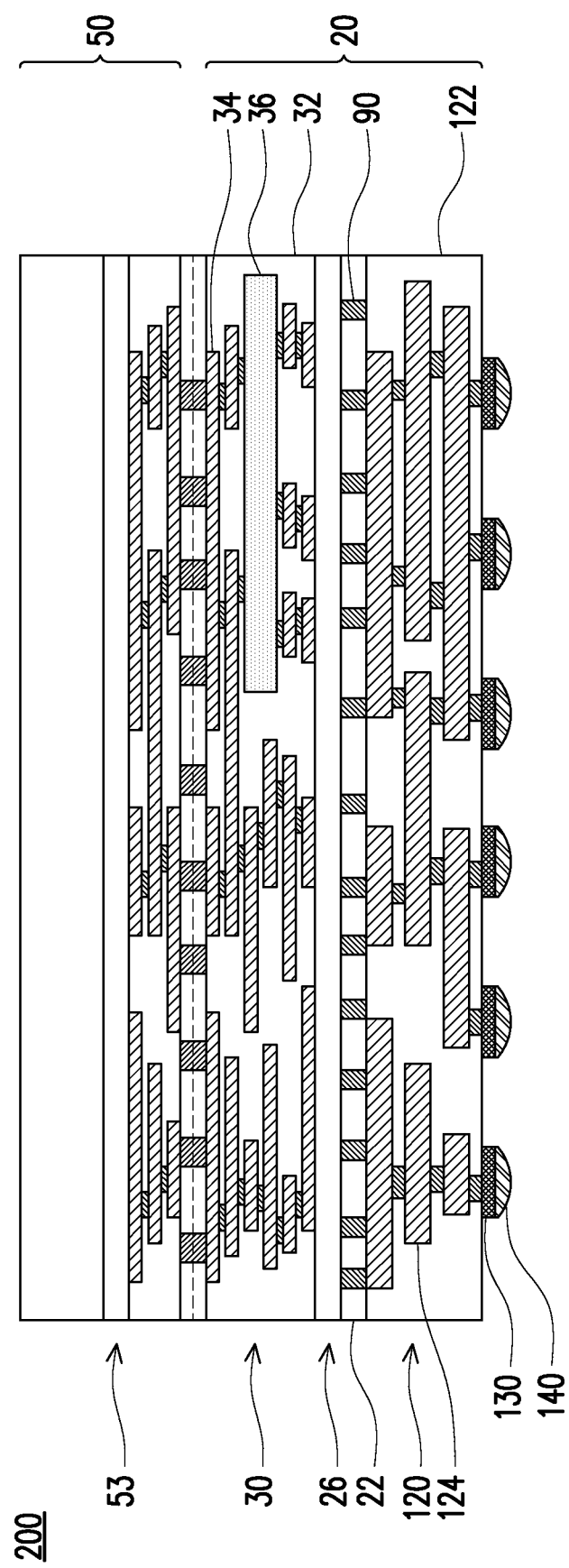
Figure 11:
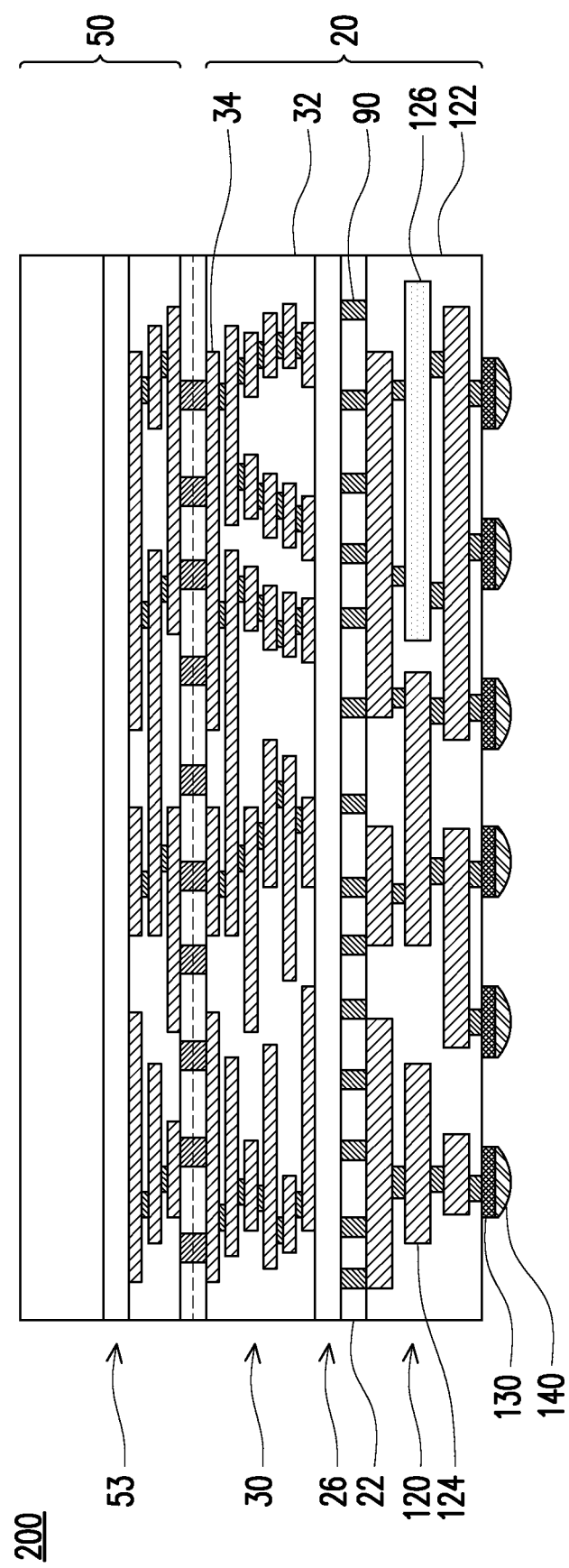

FIGS. 9 through 11 are cross-sectional views of a second integrated circuit package 200, in accordance with some embodiments. For example, the second integrated circuit package 200 is formed by bonding a second integrated circuit device 50 to the first integrated circuit device 20, for example, provided in FIG. 2. In an embodiment, the second integrated circuit package 200 comprises a chip-on-wafer (CoW) package, although it should be appreciated that embodiments may be applied to other three-dimensional integrated circuit (3DIC) packages.

In FIG. 9, the second integrated circuit package 200 is formed by attaching a second integrated circuit device 50 (e.g., a die or a chiplet) to the first integrated circuit device 20. The second integrated circuit device 50 may be a logic device (e.g., central processing unit (CPU), graphics processing unit (GPU), microcontroller, etc.), a memory device (e.g., dynamic random access memory (DRAM) die, static random access memory (SRAM) die, etc.), a power management device (e.g., power management integrated circuit (PMIC) die), a radio frequency (RF) device, a sensor device, a micro-electro-mechanical-system (MEMS) device, a signal processing device (e.g., digital signal processing (DSP) die), a front-end device (e.g., analog front-end (AFE) dies), the like, or combinations thereof (e.g., a system-on-a-chip (SoC) die). The first integrated circuit device 20 (or substrate 22) on which the second integrated circuit packages 200 are formed may include different device regions that are singulated in previous or subsequent steps to form a plurality of the second integrated circuit packages 200. The second integrated circuit device 50 includes a semiconductor substrate 52, an interconnect structure 54, fifth conductive features 56, and third dielectric layers 58. The interconnect structure 54 (e.g., the third dielectric layers 58 and the fifth conductive features 56) may be formed using the similar methods as described above with the front-side interconnect structure 30 and the back-side interconnect structure 120.

The second integrated circuit device 50 may be attached using the methods described above in connection with attaching the carrier wafer 60 to the first integrated circuit device 20. For example, a hybrid bonding may be used to attach the second integrated circuit device 50 to the first integrated circuit device 20. In some embodiments, the second bonding layer 46 and the third conductive features 47 may be formed over the third dielectric layers 58 and the fifth conductive features 56 of the second integrated circuit device 50. As a result, the first bonding layer 44 and the second conductive features 45 formed over the first integrated circuit device 20 may hybrid bond with the second bonding layer 46 and the third conductive features 47 formed over the second integrated circuit device 50 to form a hybrid bonding layer. In other embodiments not specifically illustrated, the second integrated circuit device 50 may already include an exposed dielectric layer (e.g., an oxide layer) with conductive elements (e.g., die connectors) embedded therein. As a result, the first bonding layer 44 and the second conductive features 45 formed over the first integrated circuit device 20 may hybrid bond with the exposed dielectric layer and the embedded conductive elements of the second integrated circuit device 50 to form the hybrid bonding layer.

After attaching the second integrated circuit device 50, the intermediate structure may be flipped over for subsequent processing, similarly as described above in connection with FIGS. 4-6. For example, the TSVs 90 may be formed over the back-side of the device layer 26 and the back-side interconnect structure 120 may be formed over the TSVs 90. The UBMs 130 and the conductive connectors 140 may then be formed over the back-side interconnect structure 120.

The second integrated circuit package 200 may achieve the same or similar benefits as described above in connection with the first integrated circuit package 100. In particular, the versatility of having the front-side memory array (e.g., including the front-side memory elements 36) and the back-side memory array (e.g., including the back-side memory elements 126) may be advantageous in regard to the additional circuitry routing that may be used to incorporate the second integrated circuit device 50 into the completed integrated circuit.

As discussed above, the second integrated circuit device 50 may be a memory die. For example, the second integrated circuit device 50 may include a device layer 53 comprising, for example, active devices such as transistors composing various memory cells (e.g., SRAM cells). The second integrated circuit device 50 may be formed with legacy node technology (e.g., older technology) as compared with the first integrated circuit device 20. As a result, attaching the second integrated circuit device 50 allows for the older legacy technology to be incorporated with the newer technology of the device layer 26, the front-side interconnect structure 30, the TSVs 90, and the back-side interconnect structure 120 to form a complete integrated circuit. Accordingly, the completed integrated circuit may seamlessly combine the technology nodes of the second integrated circuit device 50 and the first integrated circuit device 20, whether those technology nodes are the same or different.

In accordance with some embodiments, the front-side memory array (e.g., the front-side memory elements 36 and corresponding devices in the device layer 26) and the back-side memory array (e.g., the back-side memory elements 126 and corresponding devices in the device layer 26) are non-volatile memories. The non-volatile memories may include RRAM, MRAM, PCRAM, FeRAM, the like, or combinations thereof. The back-side memory array may include the same type or a different type of non-volatile memory as compared to the front-side memory array.

In some embodiments when it may be advantageous for the front-side interconnect structure 30 to be dedicated to circuitry other than or in addition to NVM purposes (e.g., due to presence of the second integrated circuit device 50 attached over the front-side interconnect structure 30), the back-side memory elements 126 of the back-side memory array may occupy a larger area or be weighted more heavily than the front-side memory elements 36 of the front-side memory array. For example, the weighting of the back-side memory elements 126 may be between about 0% and about 100% of the total number of the memory elements in the first integrated circuit device 20. In some embodiments, almost all NVM may be integrated in the back-side memory elements 126. In other embodiments when it may be advantageous for the front-side interconnect structure to be dedicated to NVM purposes (e.g., to coordinate memory functionality with the second integrated circuit device 50), the front-side memory elements 36 of the front-side memory array may occupy a larger area or be weighted more heavily than the back-side memory elements 126 of the back-side memory array. For example, the weighting of the front-side memory elements 36 may be between about 0% and about 100% of the total number of the memory elements in the first integrated circuit device 20. In some embodiments, almost all NVM may be integrated in the front-side memory elements 36.

In FIG. 10, in accordance with some embodiments of the second integrated circuit package 200, the back-side interconnect structure 120 may be formed without any memory elements (e.g., excluding the back-side memory elements 126) while the front-side interconnect structure 30 is formed with the front-side memory elements 36. For example, all memory devices of the second integrated circuit package 200 may be formed in the front-side interconnect structure 30 and, optionally, in the second integrated circuit device 50 if comprising a memory die. As a result, the second integrated circuit package 200 may achieve the same or similar benefits as the first integrated circuit package 100, for example, as described above in connection with FIG. 7. In addition to the benefits stated above, weighting the front-side interconnect structure 30 with the front-side memory elements 36 to form the front-side memory array allows for greater complexity and intricacy for connecting the second integrated circuit device 50 (e.g., a memory device such as SRAM) to the front-side memory array and/or other portions of the front-side interconnect structure 30. As a result, in embodiments in which the second integrated circuit device 50 contains SRAM legacy technology, the front-side memory array is physically and electrically nearby to provide assistance in memory capacity as well as improved integration into the integrated circuit.

In FIG. 11, in accordance with other embodiments of the second integrated circuit package 200, the front-side interconnect structure 30 may be formed without any memory elements (e.g., excluding the front-side memory elements 36) while the back-side interconnect structure 120 is formed with the back-side memory elements 126. For example, all memory devices of the second integrated circuit package 200 may be formed in the back-side interconnect structure 120 and, optionally, in the second integrated circuit device 50 if comprising a memory die. As a result, the second integrated circuit package 200 may achieve the same or similar benefits as the first integrated circuit package 100, for example, as described above in connection with FIG. 8. In addition to the benefits stated above, weighting the back-side interconnect structure 120 with the back-side memory elements 126 to form the back-side memory array allows for greater complexity for integrating, for example, similar or newer technology of the second integrated circuit device 50 into the integrated circuit through the front-side interconnect structure 30.

Figure 12:
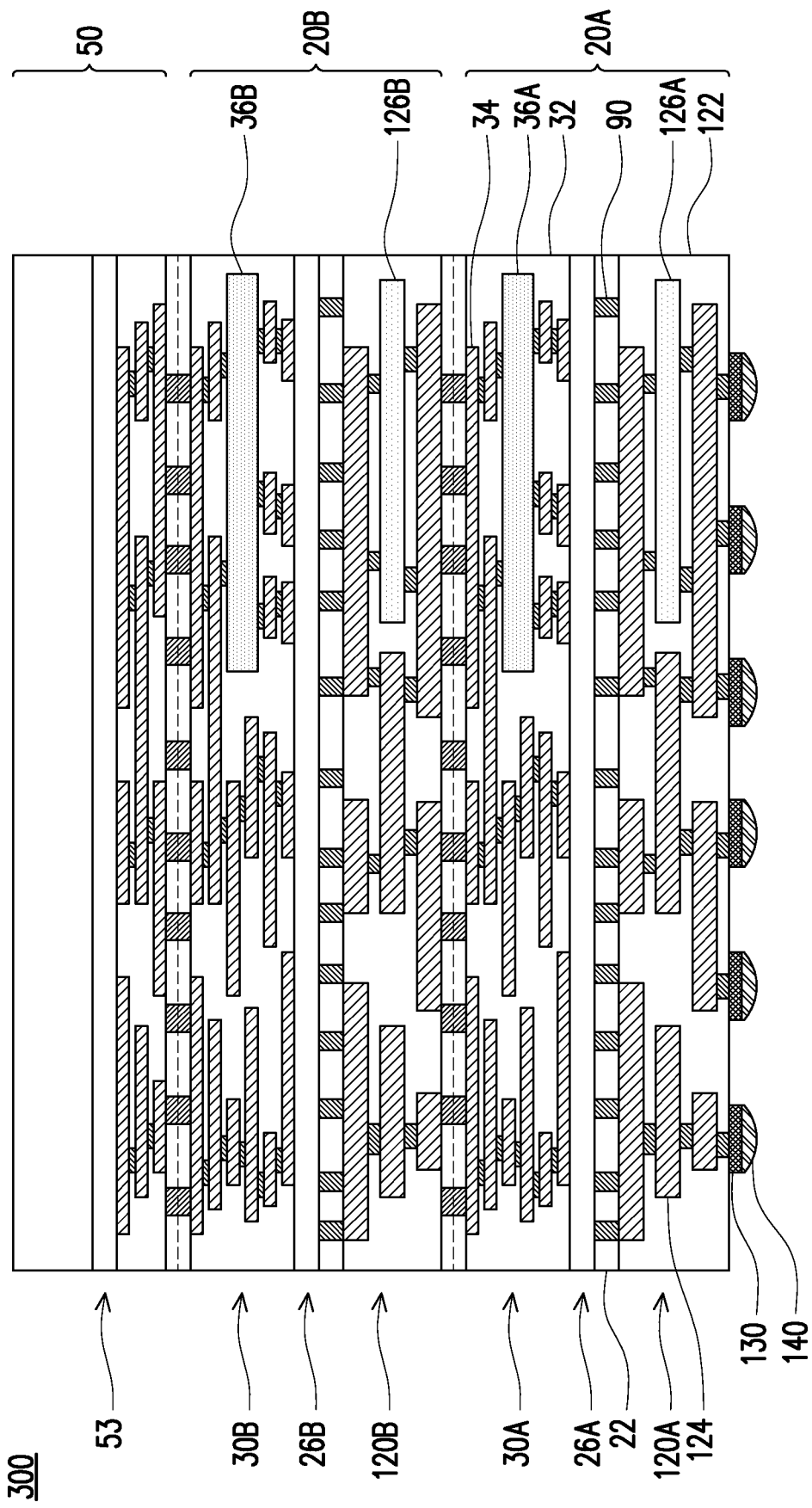
FIG. 12 is a cross-sectional view of an intermediate step during processes for forming an integrated circuit package, in accordance with some embodiments.

In FIG. 12, a third integrated circuit package 300 may be formed by attaching the second integrated circuit device 50 or the carrier wafer 60 over a stack of multiple dies. In an embodiment, the third integrated circuit package 300 comprises a CoW package, although it should be appreciated that embodiments may be applied to other 3DIC packages. The third integrated circuit package 300 may be formed by stacking a plurality of devices. For example, a plurality of the first integrated circuit device 20A and 20B may be stacked before attaching the second integrated circuit device 50 or the carrier wafer 60. The plurality of the first integrated circuit devices 20A and 20B may be similar or different types of semiconductor devices.

In some embodiments, the third integrated circuit package 300 may be formed by first forming the front-side interconnect structure 30 of the first integrated circuit device 20A, and then attaching the first integrated circuit device 20B using the methods described above (e.g., hybrid bonding) in connection with attaching the carrier wafer 60 and/or the second integrated circuit device 50. Afterward, the second integrated circuit device 50 may also be attached to the first integrated circuit device 20B using the methods described above (e.g., hybrid bonding). In other embodiments not specifically illustrated, the carrier wafer 60 may be attached instead of the second integrated circuit device 50.

The TSVs 90, the back-side interconnect structure 120, the UBMs 130, and/or the conductive connectors 140 may be formed after attaching the second integrated circuit device 50 (or the carrier wafer 60). In some embodiments, one or more of these elements, such as the TSVs 90 and the back-side interconnect structure 120, may be formed over the back-side of the device layer 26 before attaching the second integrated circuit device 50 and/or the first integrated circuit device 20B. It should be noted that the stack of devices may include more of the first integrated circuit device 20 or other types of devices not specifically discussed.

In accordance with some embodiments, the front-side memory arrays (e.g., the front-side memory elements 36A/B and corresponding devices in the device layers 26A/B) and the back-side memory array (e.g., the back-side memory elements 126A/B and corresponding devices in the device layers 26A/B) are non-volatile memories. The non-volatile memories may include RRAM, MRAM, PCRAM, FeRAM, the like, or combinations thereof. The back-side memory array may include the same type or a different type of non-volatile memory as compared to the front-side memory array.

As illustrated, all of the devices in the plurality of the first integrated circuit devices 20A and 20B may include both of the front-side memory arrays (e.g., the front-side memory elements 36A and 36B) and the back-side memory arrays (e.g., the back-side memory elements 126A and 126B). However, any of the front-side interconnect structures 30A and 30B and/or the back-side interconnect structures 120A and 120B may be formed without the corresponding memory elements 36A/B and/or 126A/B. The various embodiments from including the memory elements of different weights (or excluding any of the memory elements) in each interconnect structure facilitates greater versatility of the circuitry in the completed integrated circuit. As a result, greater flexibility may be utilized to improve efficiency of logic computing and to increase memory capacity (e.g., the total non-volatile memory capacity).

In FIGS. 13A through 15B, a fourth integrated circuit package 400 may be formed by attaching any of the integrated circuit packages described above (e.g., the first integrated circuit package 100, the second integrated circuit package 200, or the third integrated circuit package 300) into an integrated circuit fan-out (InFO) package. In an embodiment, the fourth integrated circuit package 400 comprises a CoW package, although it should be appreciated that embodiments may be applied to other 3DIC packages.

In some embodiments of assembling the fourth integrated circuit package 400, the integrated circuit package 100/200/300 may be singulated and attached to a redistribution structure 150 (e.g., a fan-out redistribution structure) using any suitable method, such as with the conductive connectors 140 (not specifically illustrated). External UBMs 160 and external connectors 170 may be formed over an opposite side of the redistribution structure 150 using similar methods as described above in connection with the UBMs 130 and the conductive connectors 140. In addition, a molding compound may be formed around lateral edges of the integrated circuit package 100/200/300.

In other embodiments of assembling the fourth integrated circuit package 400, the redistribution structure 150 may be formed over the back-side interconnect structure 120 without first forming the UBMs 130 and the conductive connectors 140. The external UBMs 160 and the external connectors 170 may then be formed over the redistribution structure 150, and the molding compound 152 may be formed around the integrated circuit package 100/200/300.

Figure 13A:
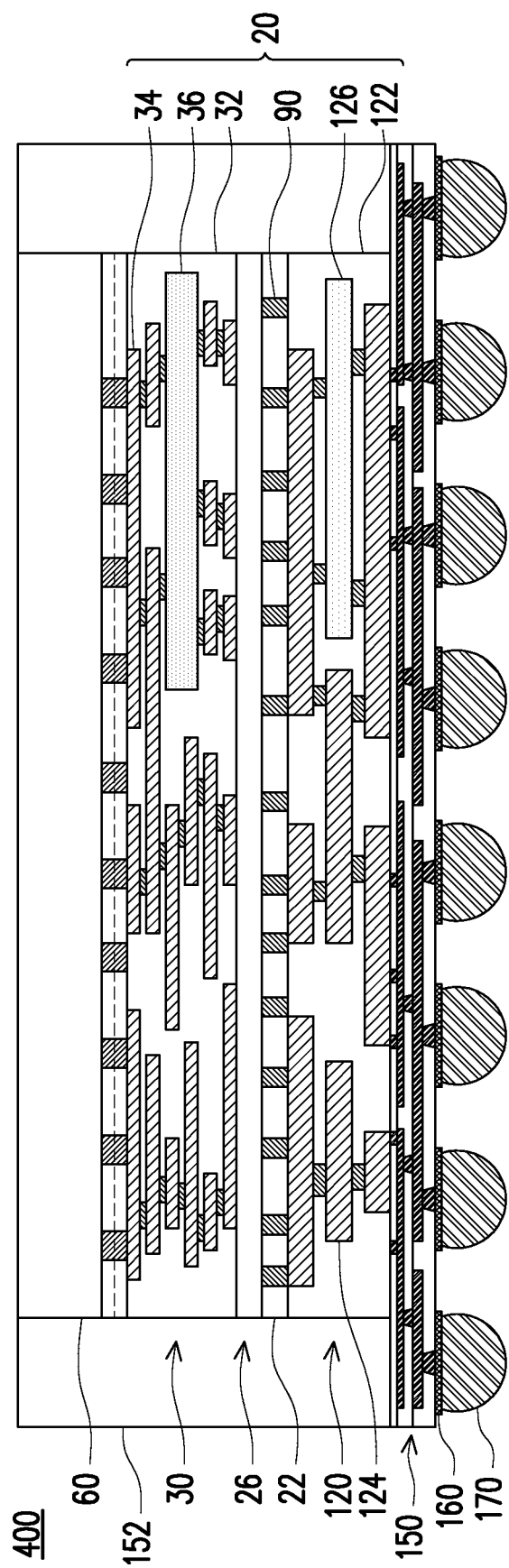
FIGS. 13A, 13B, 14A, 14B, 15A, and 15B are cross-sectional views of intermediate steps during processes for forming an integrated circuit package, in accordance with some embodiments.
Figure 13B:
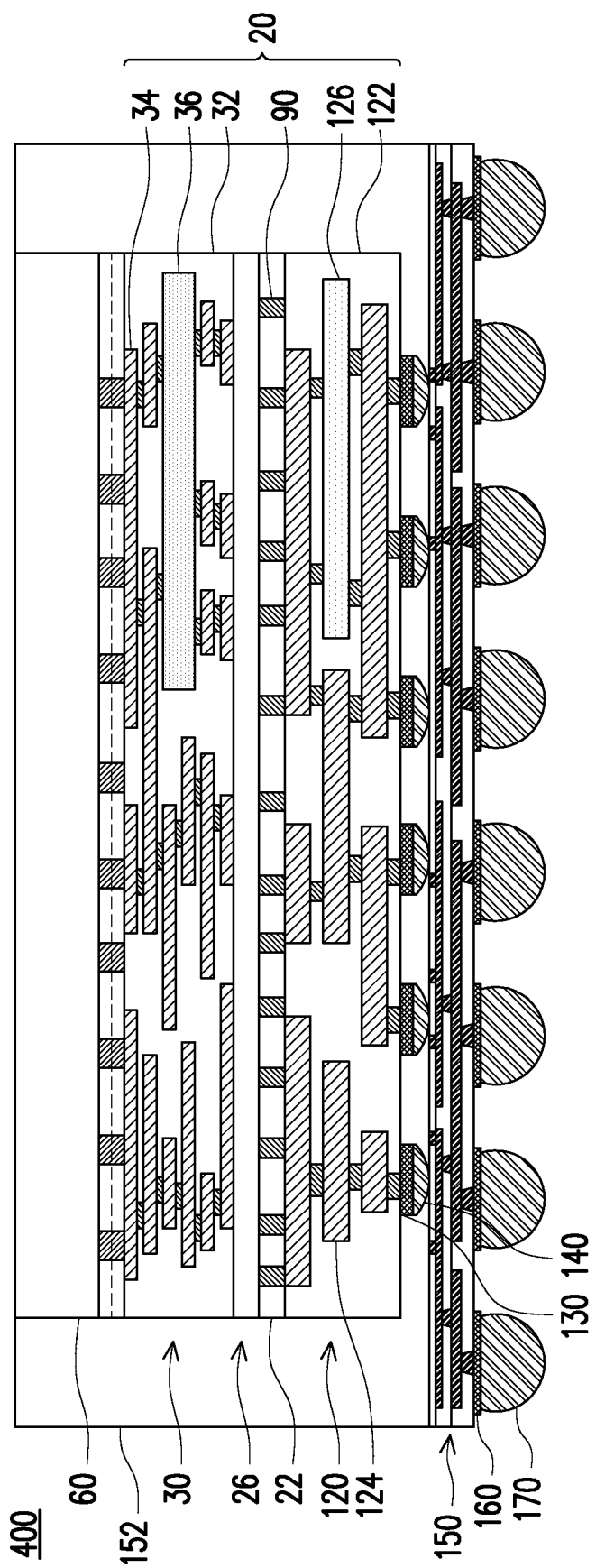

Referring specifically to FIGS. 13A and 13B, memory devices may be formed in both the front-side interconnect structure 30 (e.g., the memory elements 36) and the back-side interconnect structure 120 (e.g., the memory elements 126), thereby achieving additional advantages as described above in connection with FIG. 6A. In other embodiments not specifically illustrated, the back-side interconnect structure 120 may be formed excluding the memory elements 136, thereby achieving additional advantages as described above in connection with FIG. 7. And in yet other embodiments not specifically illustrated, the front-side interconnect structure 30 may be formed excluding the memory elements 36, thereby achieving additional advantages as described above in connection with FIG. 8. In FIG. 13B, in some embodiments, the first integrated circuit device 20 may be attached to the redistribution structure 150 using the UBMs 130 and the conductive connectors 140 discussed above.

Figure 14A:
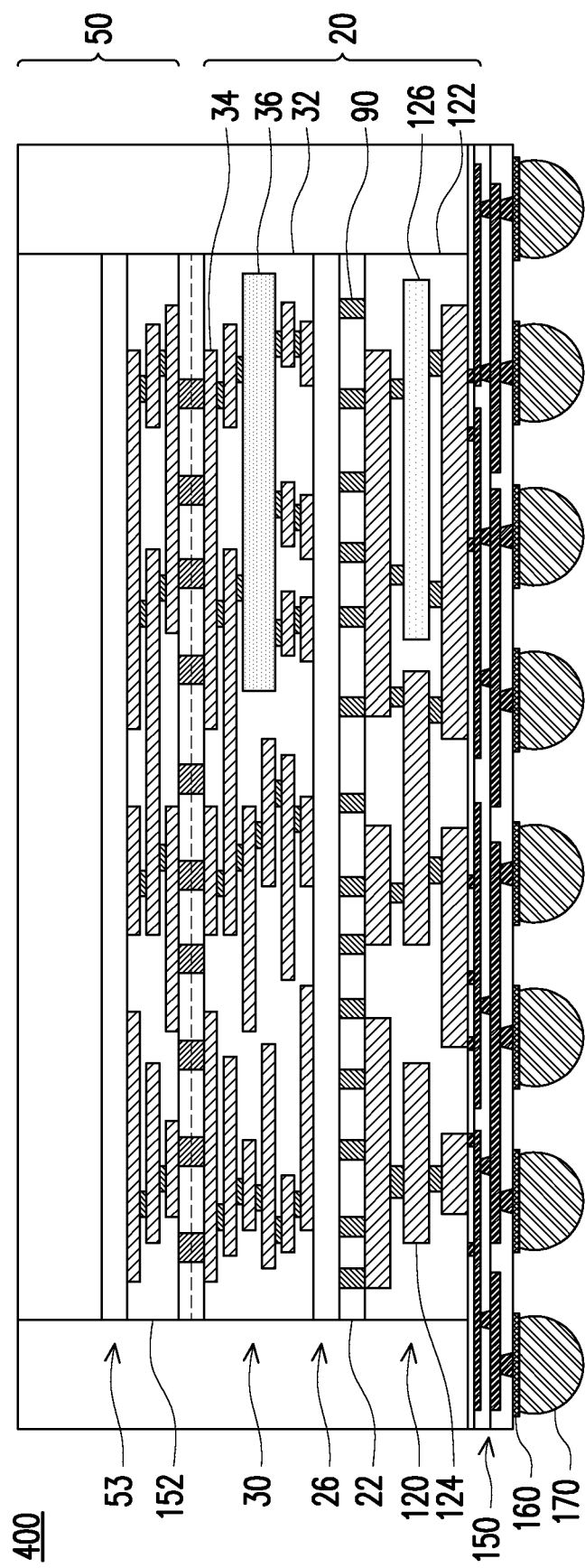
Figure 14B:
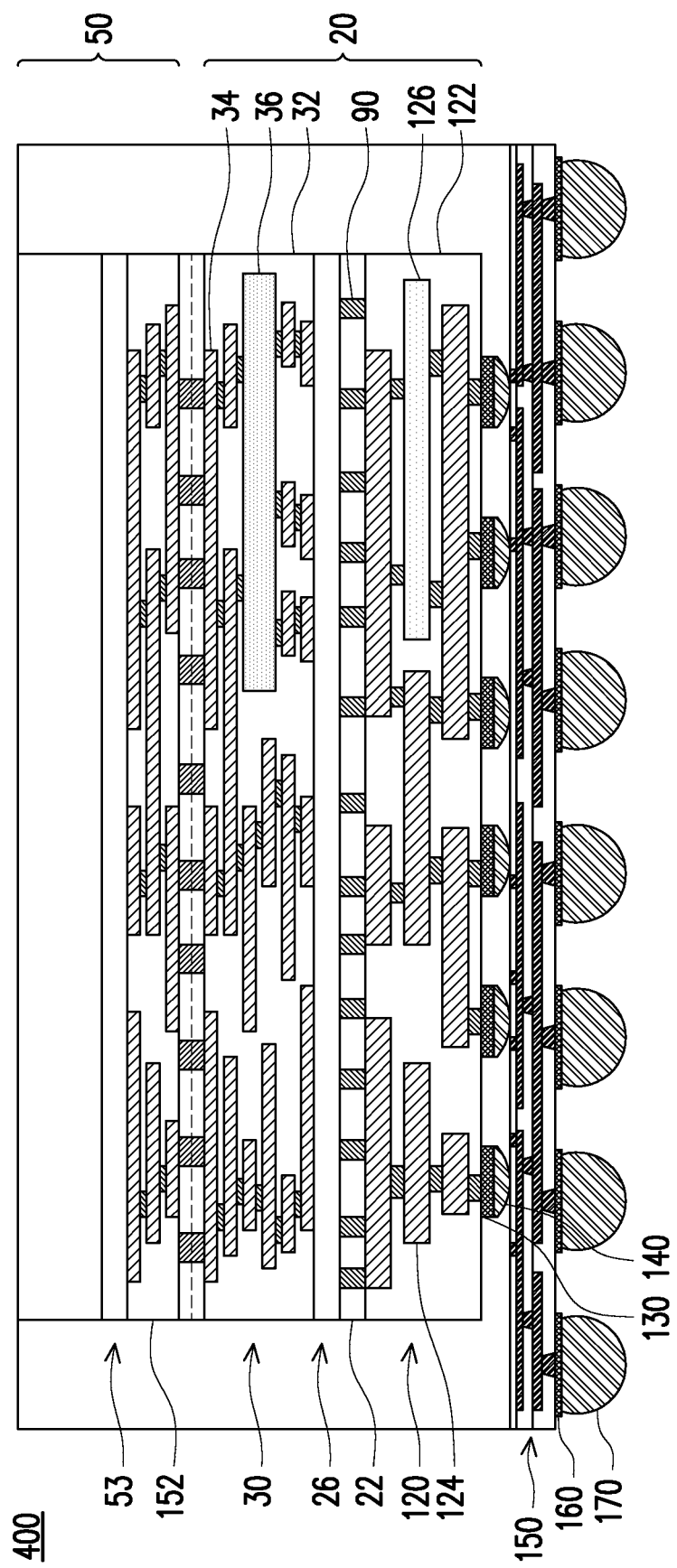

Referring specifically to FIG. 14A, memory devices may be formed in both the front-side interconnect structure 30 (e.g., the memory elements 36) and the back-side interconnect structure 120 (e.g., the memory elements 126), thereby achieving additional advantages as described above in connection with FIG. 9. In other embodiments not specifically illustrated, the back-side interconnect structure 120 may be formed excluding the memory elements 136, thereby achieving additional advantages as described above in connection with FIG. 10. And in yet other embodiments not specifically illustrated, the front-side interconnect structure 30 may be formed excluding the memory elements 36, thereby achieving additional advantages as described above in connection with FIG. 11. In FIG. 14B, in some embodiments, the first integrated circuit device 20 may be attached to the redistribution structure 150 using the UBMs 130 and the conductive connectors 140 as discussed above.

Figure 15A:
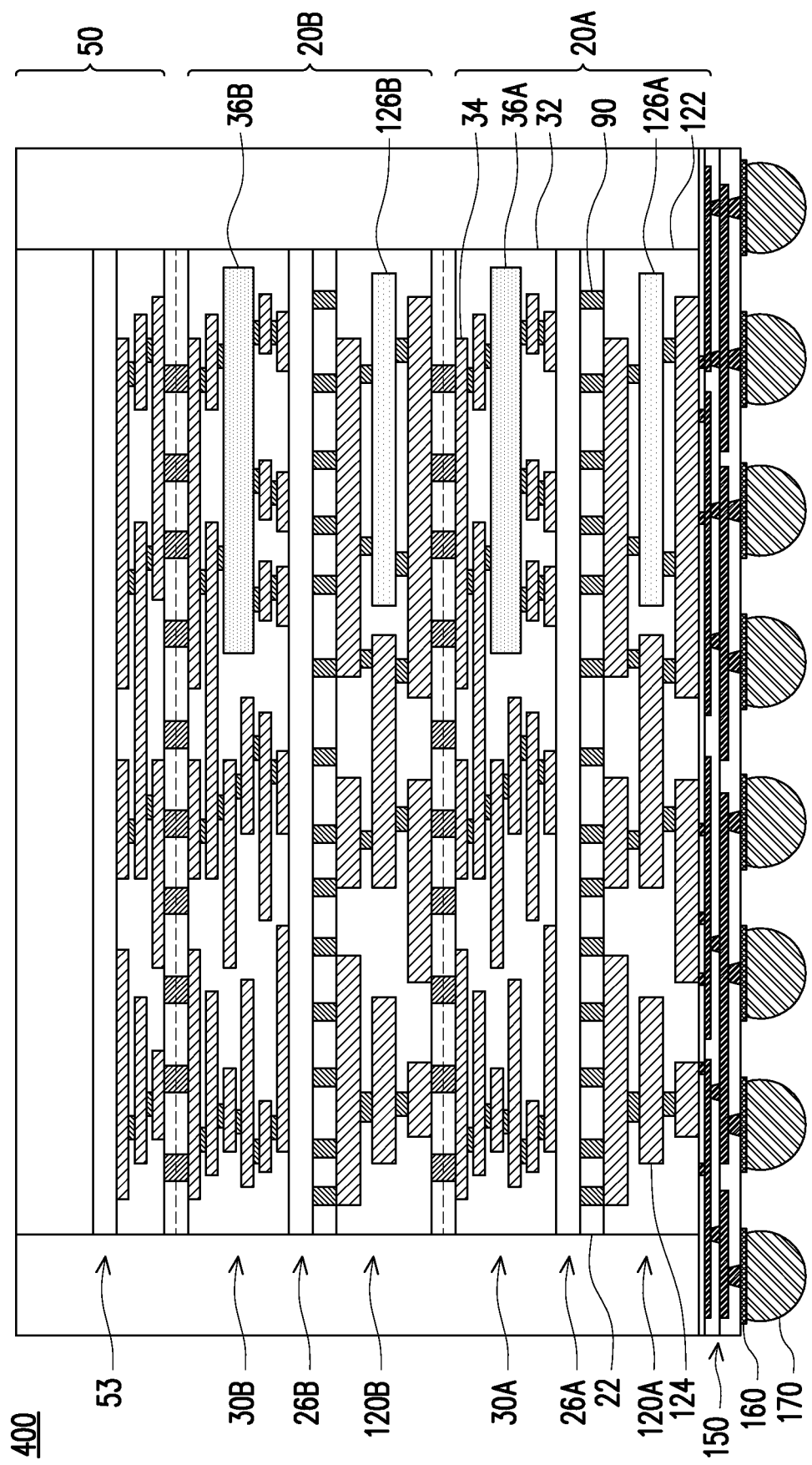
Figure 15B:
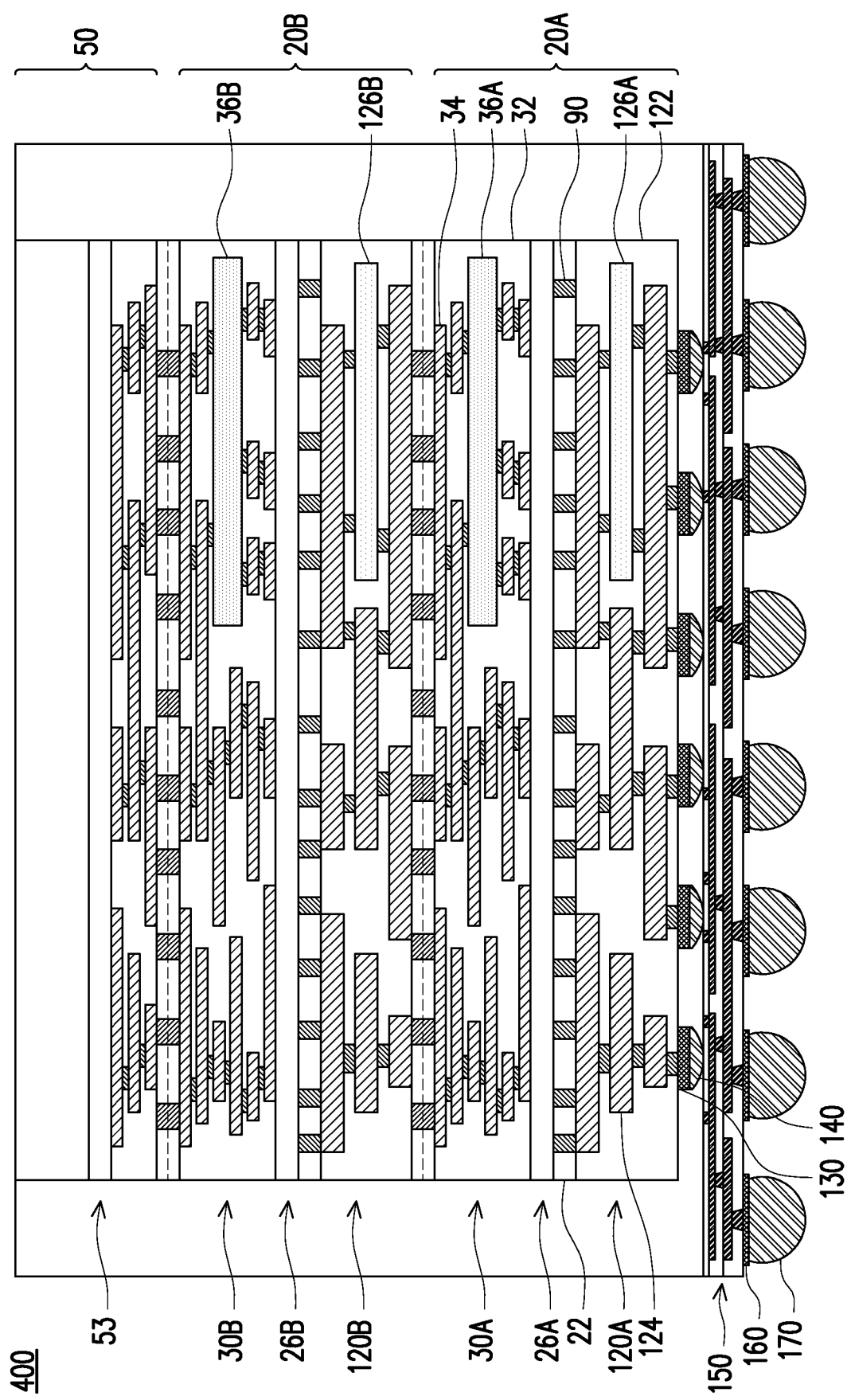

Referring specifically to FIG. 15A, memory devices may be formed in both of the front-side interconnect structures 30A/B (e.g., the memory elements 36A/B) and both of the back-side interconnect structures 120A/B (e.g., the memory elements 126A/B), thereby achieving additional advantages as described above in connection with FIG. 12. In other embodiments not specifically illustrated, any combination of forming or excluding memory devices in the front-side interconnect structures 30A/B and the back-side interconnect structures 120A/B may be implemented to achieve the additional advantages as further described above in connection with FIG. 12. In FIG. 15B, in some embodiments, the first integrated circuit device 20 may be attached to the redistribution structure 150 using the UBMs 130 and the conductive connectors 140 as discussed above.

Advantages may be achieved. The embodiments described herein result in improved performances of integrated circuit packages. In particular, the integrated circuit devices of the integrated circuit packages may be fabricated with varying weights of the front-side and back-side memory arrays, and in some cases excluding the memory array in the front-side or back-side interconnect structure. The flexibility and versatility allows for improved incorporation of other devices, such as a memory device, into the completed integrated circuit. The benefits are further realized when overcoming challenges that may be associated with using legacy technology in the other devices, such as a memory device formed with an older technology node than predominantly used in the integrated circuit device.

In an embodiment, a method includes forming a device layer over a first substrate; forming a first interconnect structure over a front-side of the device layer; attaching a second substrate to the first interconnect structure; forming a second interconnect structure over a back-side of the device layer, the second interconnect structure comprising back-side memory elements, wherein the back-side memory elements and a first plurality of active devices of the device layer provide a first memory array; and forming conductive connectors over the second interconnect structure. In another embodiment, the first interconnect structure comprises front-side memory elements, and wherein the front-side memory elements and a second plurality of the active devices of the device layer provide a second memory array. In another embodiment, the second substrate comprises an integrated circuit device, and wherein at least one of the first memory array and the second memory array comprises a non-volatile memory array. In another embodiment, the second substrate is a static random access memory (SRAM) die. In another embodiment, attaching the second substrate to the first interconnect structure comprises: forming a first bonding layer and first conductive features over the first interconnect structure; and hybrid bonding a second bonding layer and second conductive features of the second substrate to the first bonding layer and the first conductive features. In another embodiment, the method further includes forming through silicon vias (TSVs) interposed between the device layer and the second interconnect structure. In another embodiment, forming the TSVs comprises: before forming the first interconnect structure, etching first recesses in the first substrate; before forming the first interconnect structure, filling the first recesses with a conductive material; and after forming the first interconnect structure, thinning the first substrate to expose the TSVs. In another embodiment, the method further includes singulating the second substrate to form an integrated circuit package; and forming a redistribution structure over the second interconnect structure, the redistribution structure having a greater lateral width than the second interconnect structure.

In an embodiment, a semiconductor device includes a device layer disposed over a first substrate, the device layer comprising first active devices and second active devices; a first interconnect structure disposed over the device layer, the first interconnect structure comprising first memory elements electrically connected to the first active devices to form a first memory array; an integrated circuit device disposed over the first interconnect structure, the integrated circuit device comprising a second interconnect structure; and a third interconnect structure disposed under the device layer, the third interconnect structure comprising second memory elements electrically connected to the second active devices to form a second memory array. In another embodiment, each of the first memory array and the second memory array is a non-volatile memory array. In another embodiment, the semiconductor device further includes a bonding layer being interposed between the first interconnect structure and the second interconnect structure; and conductive features embedded in the bonding layer, the conductive features being electrically interposed between the first interconnect structure and the second interconnect structure. In another embodiment, the bonding layer comprises a first dielectric bonding layer and a second dielectric bonding layer, and wherein the conductive features comprise first conductive features embedded in the first dielectric bonding layer and second conductive features embedded in the second dielectric bonding layer. In another embodiment, the integrated circuit device comprises a memory device. In another embodiment, the memory device comprises static random access memory (SRAM). In another embodiment, the semiconductor device further includes a fan-out redistribution structure disposed below the third interconnect structure; and a molding compound disposed around lateral edges of the first interconnect structure, the second interconnect structure, and the third interconnect structure.

In an embodiment, a semiconductor device includes a first interconnect structure disposed over external connectors, the first interconnect structure comprising first memory elements, the first memory elements being part of a first memory array; a first substrate disposed over the first interconnect structure, the first substrate comprising through vias; active devices disposed over the first substrate, a first plurality of the active devices being electrically connected to the first memory elements and being part of the first memory array; a second interconnect structure disposed over the active devices; and a third interconnect structure bonded to the second interconnect structure. In another embodiment, the second interconnect structure comprises second memory elements, wherein a second plurality of the active devices are electrically connected to the second memory elements, and wherein the second memory elements and the second plurality of the active devices are part of a second memory array. In another embodiment, the semiconductor device further includes additional active devices disposed over the third interconnect structure; and a semiconductor substrate disposed over the additional active devices. In another embodiment, the second substrate comprises a memory device. In another embodiment, the semiconductor device further includes a molding compound disposed around lateral edges of the first interconnect structure and over a redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a device layer over a first substrate;
   forming a first interconnect structure over a front-side of the device layer;
   attaching a second substrate to the first interconnect structure;
   forming a second interconnect structure over a back-side of the device layer, the second interconnect structure comprising back-side memory elements, wherein the back-side memory elements and a first plurality of active devices of the device layer provide a first memory array; and
   forming conductive connectors over the second interconnect structure.

2. The method of claim 1, wherein the first interconnect structure comprises front-side memory elements, and wherein the front-side memory elements and a second plurality of the active devices of the device layer provide a second memory array.

3. The method of claim 2, wherein the second substrate comprises an integrated circuit device, and wherein at least one of the first memory array and the second memory array comprises a non-volatile memory array.

4. The method of claim 3, wherein the second substrate is a static random access memory (SRAM) die.

5. The method of claim 1, wherein attaching the second substrate to the first interconnect structure comprises:
   forming a first bonding layer and first conductive features over the first interconnect structure; and
   hybrid bonding a second bonding layer and second conductive features of the second substrate to the first bonding layer and the first conductive features.

6. The method of claim 1 further comprising forming through silicon vias (TSVs) interposed between the device layer and the second interconnect structure.

7. The method of claim 6, wherein forming the TSVs comprises:
   before forming the first interconnect structure, etching first recesses in the first substrate;
   before forming the first interconnect structure, filling the first recesses with a conductive material; and
   after forming the first interconnect structure, thinning the first substrate to expose the TSVs.

8. The method of claim 1 further comprising:
   singulating the second substrate to form an integrated circuit package; and
   forming a redistribution structure over the second interconnect structure, the redistribution structure having a greater lateral width than the second interconnect structure.

9. A method comprising:
   forming active devices along a front-side of a first substrate, the first substrate comprising a through via extending from the front-side partially through the first substrate;
   forming a first interconnect structure over the active devices and the front-side of the first substrate, forming the first interconnect structure comprising:
     forming a first conductive line layer over the active devices;
     forming a second conductive line layer and first memory elements over the first conductive line layer; and
     forming a third conductive line layer over the second conductive line layer and the first memory elements;
   attaching a second substrate over the third conductive line layer;

thinning a back-side of the first substrate to expose the through via; and forming a second interconnect structure over the through via and the back-side of the first substrate, the second interconnect structure comprising second memory elements.

10. The method of claim 9, wherein attaching the second substrate comprises attaching an integrated circuit die over and electrically connected to the third conductive line layer.

11. The method of claim 10, further comprising forming external connectors over the second interconnect structure.

12. The method of claim 9, wherein the first interconnect structure comprises a first non-volatile memory array, and wherein the first non-volatile memory array comprises the first memory elements, a portion of the first conductive line layer, and a first set of the active devices.

13. The method of claim 12, wherein the second interconnect structure comprises a second non-volatile memory array, and wherein the second non-volatile memory array comprises the second memory elements and a second set of the active devices.

14. The method of claim 13, wherein each of the first non-volatile memory array and the second non-volatile memory array comprises at least one of a resistive random access memory, a magnetoresistive random access memory, a phase change random access memory, or a ferroelectric random access memory.

15. A method comprising:
forming a first memory array over a front-side of a first substrate, forming the first memory array comprising:
  forming first transistors along the front-side of the first substrate;
  forming a first portion of a first interconnect structure over the first transistors; and
  forming first memory elements over the first portion of the first interconnect structure;
forming a second portion of the first interconnect structure over the first memory elements;
forming a second memory array over a back-side of the first substrate, forming the second memory array comprising:
  simultaneously with forming the first transistors, forming second transistors along the front-side of the first substrate;
  thinning the back-side of the first substrate to expose through vias embedded in the first substrate;
  forming a first portion of a second interconnect structure over the through vias and the back-side of the first substrate; and
  forming second memory elements over the first portion of the second interconnect structure; and
forming a second portion of the second interconnect structure over the second memory elements.

16. The method of claim 15, wherein the first memory array comprises a first type of non-volatile memory array, and wherein the first type of non-volatile memory array comprises resistive random access memory, magnetoresistive random access memory, phase change random access memory, or ferroelectric random access memory.

17. The method of claim 16, wherein the second memory array comprises a second type of non-volatile memory array, wherein the second type of non-volatile memory array comprises resistive random access memory, magnetoresistive random access memory, phase change random access memory, or ferroelectric random access memory, and wherein the second type is different than the first type.

18. The method of claim 15, further comprising, before thinning the back-side of the first substrate:
forming a first bonding layer over the second portion of the first interconnect structure, the first bonding layer comprising a first conductive feature embedded in a first dielectric bonding layer; and
bonding an integrated circuit die to the first bonding layer, the integrated circuit die comprising a second bonding layer disposed adjacent to a second substrate, the second bonding layer comprising a second conductive feature embedded in a second dielectric bonding layer.

19. The method of claim 18, wherein after bonding the integrated circuit die, the first dielectric bonding layer and the second dielectric bonding layer are dielectric-to-dielectric bonded, and the first conductive feature and the second conductive feature are metal-to-metal bonded.

20. The method of claim 19, wherein the integrated circuit die further comprises:
active devices along the second substrate; and
a third interconnect structure being interposed between the active devices and the second bonding layer.

* * * * *